United States Patent
Sanpei et al.

(10) Patent No.: US 8,783,914 B2
(45) Date of Patent: Jul. 22, 2014

(54) LIGHT EMITTING APPARATUS AND ILLUMINATION APPARATUS

(75) Inventors: Tomohiro Sanpei, Yokosuka (JP); Erika Takenaka, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 269 days.

(21) Appl. No.: 13/255,220

(22) PCT Filed: Mar. 29, 2010

(86) PCT No.: PCT/JP2010/055536
§ 371 (c)(1),
(2), (4) Date: Sep. 7, 2011

(87) PCT Pub. No.: WO2010/113852
PCT Pub. Date: Oct. 7, 2010

(65) Prior Publication Data
US 2012/0014110 A1    Jan. 19, 2012

(30) Foreign Application Priority Data

Mar. 31, 2009 (JP) ................................. 2009-085254
May 15, 2009 (JP) ................................. 2009-118733

(51) Int. Cl.
*F21V 7/00* (2006.01)

(52) U.S. Cl.
USPC ................................. 362/296.04; 362/296.01

(58) Field of Classification Search
USPC ........................... 362/296.04, 296.01; 257/98
See application file for complete search history.

(56) References Cited

U.S. PATENT DOCUMENTS

| 2008/0298063 A1 | 12/2008 | Hayashi |
| 2009/0010017 A1 | 1/2009 | Hayashi |

FOREIGN PATENT DOCUMENTS

| EP | 1928026 | 6/2008 |
| JP | 2000-174347 | 6/2000 |
| JP | 2001-057446 | 2/2001 |
| JP | 2007-201444 | 8/2007 |
| JP | 2007-214245 | 8/2007 |
| JP | 2007-273498 | 10/2007 |
| JP | 2008-112867 | 5/2008 |
| JP | 2008-251664 | 10/2008 |
| JP | 2009-064637 | 3/2009 |
| JP | 2009-065137 | 3/2009 |

OTHER PUBLICATIONS

English Language Translation of International Preliminary Report on Patentability and Written Opinion for PCT/JP2010/055536 dated Nov. 24, 2011.
European Supplementary Search Report issued in EP 10758623 on Jul. 4, 2012.
English Language Abstract of JP 2007-273498 published Oct. 18, 2007.
English Language Translation of JP 2007-273498 published Oct. 18, 2007.
English Language Abstract of JP 2008-251664 published on Oct. 16, 2008.

(Continued)

*Primary Examiner* — Vip Patel
(74) *Attorney, Agent, or Firm* — DLA Piper LLP (US)

(57) ABSTRACT

A light emitting apparatus comprising a light reflecting surface made of a metal, a light emitting element which has an electrode and is mounted on the light reflecting surface, and a sealing member which covers the light reflecting surface and the light emitting element. The sealing member has translucency and oxygen gas permeability of 40000 $cc/m^2 \cdot day$ or below.

6 Claims, 12 Drawing Sheets

(56) References Cited

OTHER PUBLICATIONS

English Language translation of JP 2008-251664 published on Oct. 16, 2008.
English Language Abstract of JP 2000-174347 published Jun. 23, 2000.
English Language Translation of JP 2000-174347 published Jun. 23, 2000.
English Language Abstract of JP 2007-201444 published Aug. 9 2007.
English Language Translation of JP 2007-201444 published Aug. 9, 2007.
English Language Abstract of JP 2009-065137 published on Mar. 26, 2009.
English Language Translation of JP 2009-065137 published on Mar. 26 2009.
English Language Abstract of JP 2008-112867 published on May 15, 2008.
English Language Translation of JP 2008-112867 published on May 15, 2008.
English Language Abstract of JP 2007-214245 published Aug. 23, 2007.
English Language Translation of JP 2007-214245 published Aug. 23, 2007.
English Language Abstract of JP 2009-064637 published on Mar. 26, 2009.
English Language Translation of JP 2009-064637 published on Mar. 26 2009.
English Language Abstract of JP 2001-057446 published Feb. 27, 2001.
English Language Translation of JP 2001-057446 published Feb. 27, 2001.
International Search Report of PCT/JP2010/055536 mailed May 11, 2010.
Decision on Refusal issued in JP 2011-507177 on Sep. 17, 2013.
English Language Translation of Decision on Refusal issued in JP 2011-507177 on Sep. 17, 2013.
Chinese Office Action issued in CN 201080015813.8 on Dec. 4, 2013.
English Language Translation of Chinese Office Action issued in CN 201080015813.8 on Dec. 4, 2013.

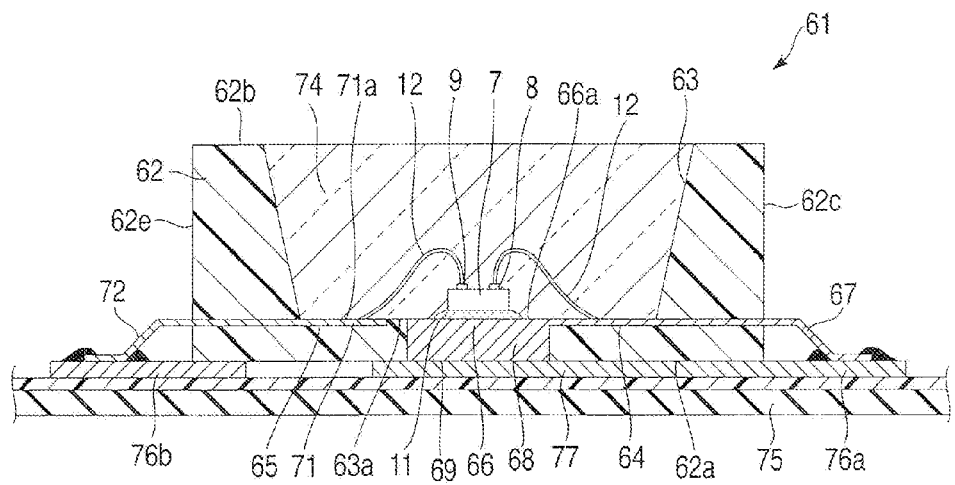
F I G. 10
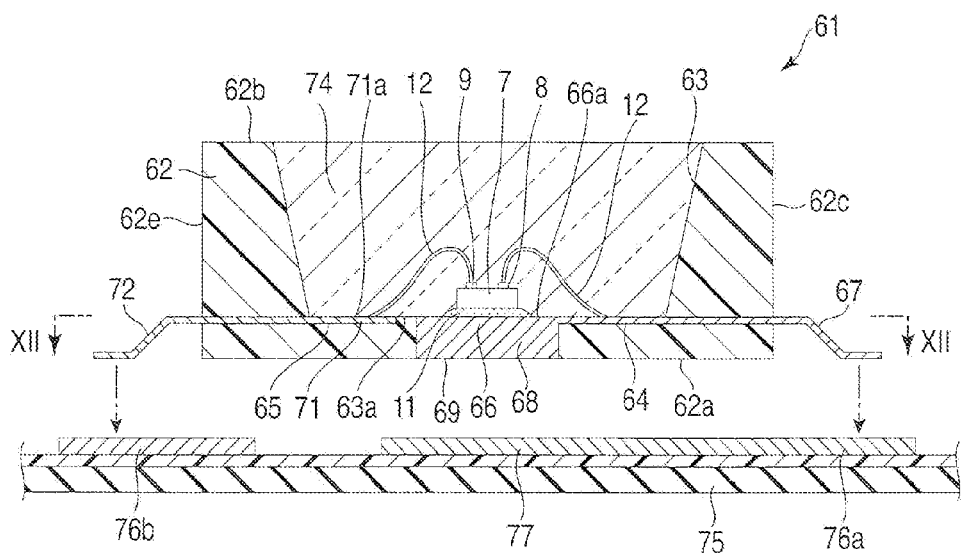
F I G. 11

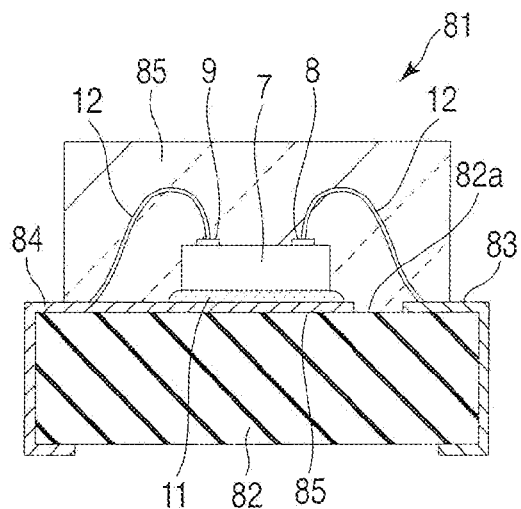
F I G. 13
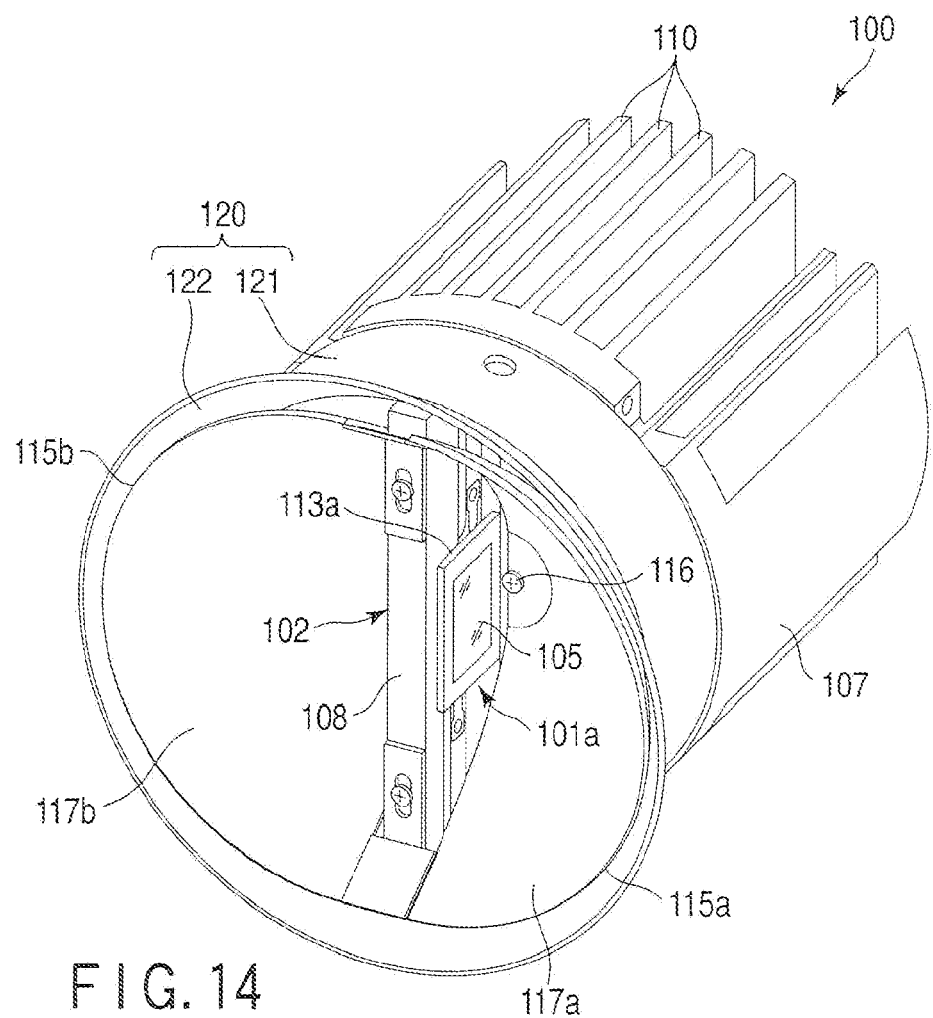
F I G. 14

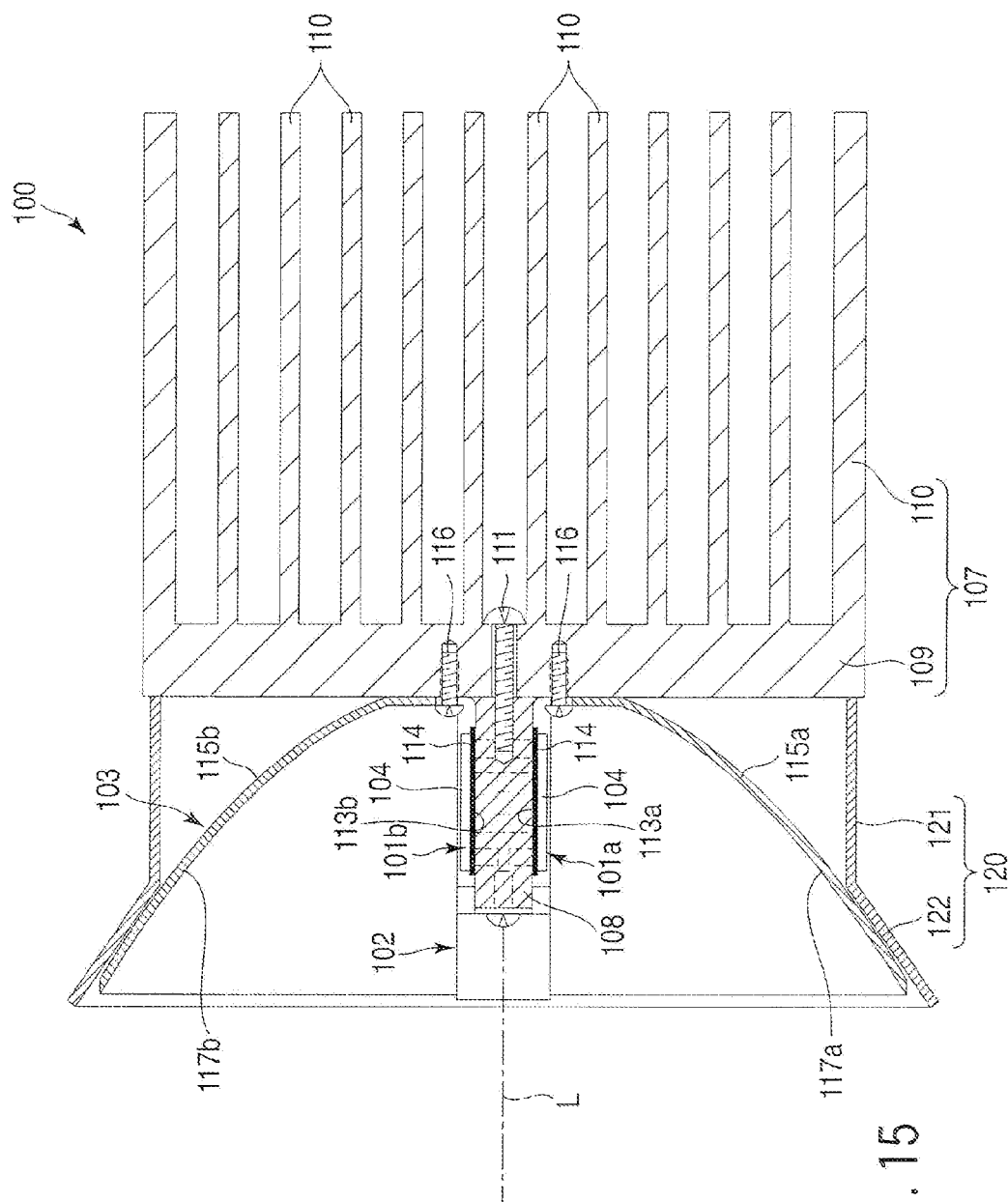
F I G. 15

LIGHT EMITTING APPARATUS AND ILLUMINATION APPARATUS

CROSS-REFERENCE TO RELATED APPLICATIONS

This application is a National Stage of International Application No. PCT/JP2010/055536 (not published in English), filed Mar. 29, 2010, which, in turn, claims the benefit of Japanese Patent Application Nos. 2009-085254, filed Mar. 31, 2009 and 2009-118733, filed May 15, 2009.

TECHNICAL FIELD

The present invention relates to a light emitting apparatus in which a light emitting element is mounted on a light reflecting surface and the light reflecting surface and the light emitting element are covered with a sealing member. Further, the present invention also relates to an illumination apparatus using the light emitting apparatus as a light source.

BACKGROUND ART

For example, Patent Document 1 discloses a light emitting apparatus which has a plurality of light emitting diodes mounted on a metal substrate.

In a conventional light emitting apparatus, a surface of a metal substrate is covered with a resin insulating layer. First and second conductive portions are provided on the insulating layer. The first conductive portion and the second conducive portion are separated by a slit and electrically insulated from each other. Back surfaces of the light emitting diodes are electrically connected to the first conductive portion. Front surfaces of the light emitting diodes are electrically connected to the second conductive portion through bonding wires.

Furthermore, the light emitting diodes are covered with a transparent sealing resin. The sealing resin continuously covers the first conductive portion, the second conductive portion, and the bonding wires.

According to the conventional light emitting apparatus, surfaces of the first and second conductive portions are covered with a metal film having oxidation resistance such as Ni or Au. A surface of this type of metal film can be maintained as a mirror finished surface, and hence the first and second conductive portions can be utilized as reflecting plates. Moreover, since the metal film is hardly oxidized, it does not lose specularity even if it is exposed to an oxidizing atmosphere.

Therefore, light traveling from the light emitting diodes to the metal substrate can be effectively reflected at positions of the first and second conductive portions toward a light fetching direction.

PRIOR ART DOCUMENT

Patent Document 1: Jpn. Pat. Appln. KOKAI Publication No. 2001-57446

SUMMARY OF THE INVENTION

Problems to be Solved

The oxidation-resistant metal film covering the first and second conductive portions is superior in that it can maintain specularity. However, contamination that reduces light reflectivity is produced on surfaces of the first and second conductive portions by a phenomenon different from oxidation.

Ascertaining a factor of this contamination has revealed that a gaseous decomposition product produced from the resin insulating layer laminated on the metal substrate adversely affects the light reflectivity of the first and second conductive portions.

The insulating layer is interposed between the metal substrate and the first and second conductive portions, and it is adjacent to the surfaces of the first and second conducive portions through the slit that separates the first conductive portion from the second conductive portion. The insulating layer exposed from the slit and the surfaces of the first and second conductive portions are covered with the sealing resin.

When the insulating layer receives light or heat from the light emitting diodes, it unavoidably gradually deteriorates to produce the gaseous decomposition product. The decomposition produced by the insulating layer reaches the surfaces of the first and second conductive portions through the sealing member, and it undergoes a color change on the surfaces of the first and second conductive portions.

Additionally, when oxygen or moisture in air reaches the surfaces of the first and second conductive portions from the surface of the sealing member through the sealing member, the gaseous composition product brings about a chemical reaction with the oxygen or the moisture on the surfaces of the first and second conductive portions.

As a result, dark contamination is formed on the surfaces of the first and second conductive portions, and it has been found that the light reflection performance of the first and second conductive portions are impaired because of this contamination.

It is an object of the present invention to obtain a light emitting apparatus that can excellently maintain light reflectivity of a light reflecting surface and efficiently extract light.

It is another object of the present invention to obtain an illumination apparatus that uses the light emitting apparatus, which can efficiently extract light, as a light source.

Means for Solving the Problems

To achieve this object, a light emitting apparatus according to an embodiment comprises: a light reflecting surface which is made of a metal; a light emitting element which has an electrode and is mounted on the light reflecting surface; and a sealing member which covers the light reflecting surface and the light emitting element. The sealing member has translucency and oxygen gas permeability defined as 40000 $cc/mm^2 \cdot day$ or below.

In this light emitting apparatus, a light emitting diode can be used as an example of the light emitting element. Any other light emitting element such as a semiconductor laser or an organic EL element can be used in place of the light emitting diode. Further, a light emitting module having one light emitting element mounted on a sub-substrate or a light emitting element module having a plurality of light emitting elements mounted on the sub-substrate may be arranged on the light reflecting surface.

Making the light reflecting surface by using a metal material having excellent light reflectivity such as silver or nickel is desirable, and silver is particularly desirable. As the sealing member, for example, it is possible to use a transparent silicone resin, a transparent urethane resin, or a transparent acrylic resin which is an example of a resin material having the translucency. The sealing member does not have to completely cover the light emitting element, and the light emitting element may be partially exposed to the outside of the sealing member.

In light emitting apparatus, to obtain white light by using, e.g., a light emitting diode that emits blue light, a yellow fluorescent material that is excited by the blue light and emits yellow light can be mixed in the sealing member. When the light emitting diode which emits the blue light is used, to improve color rendering properties of light, a red fluorescent material that is excited by the blue light and emits red light may be added to the sealing member. Furthermore, to improve visuality, a green fluorescent material may be added to the sealing member.

Moreover, to obtain white light by using a light emitting diode that emits an ultraviolet ray, a red fluorescent material that is excited by the ultraviolet ray and emits red light, a green fluorescent material that is excited by the ultraviolet ray and emits green light, and a blue fluorescent material that is excited by the ultraviolet rays and emits blue light can be mixed into the sealing member.

As the fluorescent materials, various YAG- or sialon-based materials can be used in accordance with a color of light to be obtained. In short, even if the fluorescent materials are added in the sealing member, meeting the condition that the oxygen gas permeability of the entire sealing member is 40000 cc/m$^2$·day or below is satisfactory.

In this light emitting apparatus, since the oxygen gas permeability of the sealing member is defined, materials such as oxygen in air, moisture, or a gaseous decomposition product can be prevented or suppressed from permeating the sealing member. Therefore, the materials can be prevented from reaching the light reflecting surface covered with the sealing member, and an amount of the materials that have reached this surface itself can be suppressed even if the materials have reached the light reflecting surface. Therefore, dark contamination is hardly formed on the light reflecting surface.

The light emitting apparatus according to an embodiment further comprises: a base; a conductive portion provided on the base; and an insulating portion which is provided between the base and the conducive portion and made of a resin. The light reflecting surface is formed on the conductive portion.

In this light emitting apparatus, as a material of the base, for example, a metal, a glass epoxy resin, or a ceramic can be used. When the light emitting element produces heat during operation, a base made of a metal is desirable in order to improve thermal radiation properties of the light emitting element.

When the base is made of e.g., a metal having conductive properties, the insulating portion is provided to electrically insulate the base from the conductive portion. A filler-based composite resin obtained by mixing an inorganic filler in an epoxy resin be used as a material forming the insulation portion, for example.

The conductive portion may be made by using, e.g., a metal material having excellent light reflectivity such as silver or nickel. As a method of forming the conductive portion on the base, various techniques such as application, plating, and attachment can be used. When the conductive portion is formed by electroless plating in particular, bonding strength of the conductive portion with respect to the base is increased, and a film thickness of the conductive portion can be reduced, which is beneficial.

Moreover, the conductive portion may have a single-layer configuration using one type of metal material or a multilayer configuration in which different types of metals are laminated. The light reflecting surface which requires light reflectivity is formed on the surface of the conductive portion. Therefore, when the conductive portion has the multilayer configuration, the light reflecting surface can be formed on a surface layer, and the light reflectivity of a boundary between layers is not a problem.

Additionally, the conductive portion does not have to be completely covered with the sealing member. That is, a part in the conductive portion which does not substantially adversely affect efficient light extraction may be exposed to the outside of the sealing member.

In this light emitting apparatus, even if a gaseous decomposition product is produced from deterioration in the insulating portion, the decomposition product hardly permeates the sealing member. Therefore, the decomposition product can be prevented from reaching the light reflecting surface covered with the sealing member, thereby suppressing discoloration of the light reflecting surface due to the decomposition product.

The light emitting apparatus according to an embodiment further comprises: a base; a plurality of conductive portions provided on the base; and an insulating portion which is provided between the conductive portions adjacent to each other and which is made of a resin. The insulating portion is covered with the sealing member, and the light reflecting surface is formed on each conductive portion.

For example, when the base has non-conductive properties, the insulating portion is covered with the sealing member between the conductive portions adjacent to each other. A filler-based composite resin obtained by mixing an inorganic filler in an epoxy resin may be used as a material forming the insulating portion, for example.

According to this light emitting apparatus of an embodiment, even if a gaseous decomposition product is produced from deterioration in the insulating portion, the decomposition product hardly permeates the sealing member. Therefore, the decomposition product can be prevented from reaching the light reflecting surfaces of the conductive portions adjacent to each other, thereby suppressing discoloration of the light reflecting surfaces caused by the decomposition product.

The light emitting apparatus according to an embodiment further comprises: a base; a light reflecting portion which is provided on the base and has the light reflecting surface; and an insulating portion which is provided between the base and the light reflecting portion and made of a resin.

In this light emitting apparatus, energization for the light emitting element may be carried out by using wire bonding or general lead wires. When the light reflecting portion has conductive properties, the light reflecting portion can be utilized as a conductor that energizes the light emitting element. Further, a dedicated conductive portion electrically connected to the light emitting element may be provided with the light reflecting portion. When the light reflecting portion has non-conductive properties, a dedicated conductor pattern that supplies a current to the light emitting element can be provided to the light reflecting portion. The conductor pattern may or may not have light reflectivity.

Furthermore, when a plurality of light emitting elements are mounted on the light reflecting surface, electrodes of the respective light emitting elements may be directly electrically connected to each other through, e.g., bonding wires.

The light reflecting portion can be made of, e.g., a metal material having excellent light reflectivity such as silver or nickel. As a method of forming the light reflecting portion on the base, various techniques such as application, plating, and attachment can be used. When the light reflecting portion is formed by electroless plating in particular, bonding strength of the light reflecting portion with respect to the base is increased, and a film thickness of the light reflecting portion can be reduced, which is beneficial.

Moreover, the light reflecting portion may have a single-layer configuration using one type of metal material or a multilayer configuration in which different types of metals are laminated. The light reflecting surface which requires light reflectivity is formed on the surface of the light reflecting portion. Therefore, when the light reflecting portion has the multilayer configuration, the light reflecting surface can be formed on a surface layer, and the light reflectivity of a boundary between layers is not a problem.

For example, a filler-based composite resin obtained by mixing an inorganic filler in an epoxy resin can be used, but any other resin material can be adopted. For example, when the base and the light reflecting portion are made of a conductive metal, the insulating portion is provided to electrically insulate the base from the light reflecting portion. Moreover, when a protruding portion that protrudes around the light reflecting portion is formed to the insulating portion, the protruding portion of the insulating portion can be arranged to be adjacent to the light reflecting portion.

Additionally, the light reflecting portion and the insulating portion do not have to be completely covered with the sealing member. That is, parts in the light reflecting portion and the insulating portion which do not substantially adversely affect efficient light extraction may be exposed to the outside of the sealing member.

According to this light emitting apparatus, even if a gaseous decomposition product is produced from deterioration in the insulating portion, the sealing member blocks permeation of the decomposition product. Therefore, the decomposition product can be prevented from reaching the light reflecting surface of the light reflecting portion, thereby suppressing discoloration of the light reflecting surface due to the decomposition product.

The light emitting apparatus according to an embodiment further comprises: a base; a plurality of light reflecting portions which are provided on the base; and an insulating portion which is provided between the light reflecting portions adjacent to each other and which is made of a resin. The insulating portion is covered with the sealing member, and the light reflecting surface is formed on each light reflecting portion.

For example, when the base has non-conductive properties and the light reflecting portion has conductive properties, the insulating portion does not have to be interposed between the base and the light reflecting portion. The insulating portion may be possibly provided to electrically insulate the light reflecting portion from the other conductive members. Further, the insulating portion is covered with the sealing member between the light reflecting portions adjacent to each other. For example, a filler-based composite resin obtained by mixing an inorganic filler in an epoxy resin can be utilized as a material for forming the insulating portion.

According to this light emitting apparatus, even if a gaseous decomposition product is produced from deterioration in the insulating portion, the sealing member blocks permeation of the decomposition product. Therefore, the decomposition product hardly reaches the light reflecting surfaces of the light reflecting portions adjacent to each other, and discoloration of the light reflecting surface due to the decomposition product is suppressed.

In the light emitting apparatus according to an embodiment, the insulating portion contains a resin material and a filler added to the resin material, and a content ratio of the filler is defined as 50% or above. As the filler, an inorganic filler such as an aluminum oxide ($Al_2O_3$) can be used.

According to this light emitting apparatus of, an amount of the resin is reduced in accordance with an amount of the filler. Therefore, even if the resin material constituting the insulating portion deteriorates, since the amount of the resin itself is small, an amount of the gaseous decomposition product produced from the insulating portion is decreased.

As a result, the sealing material blocks permeation of the decomposition product, the decomposition product hardly reaches the light reflecting surface, and an amount of the decomposition product is small even if the decomposition product has reached the light reflecting surface. Therefore, dark contamination is hard to be produced on the light reflecting surface, and light reflection performance of the light reflecting surface can be excellently maintained for a long time.

A light emitting apparatus according to an embodiment comprises: a light reflecting portion which has a light reflecting surface; a light emitting element mounted on the light reflecting surface; an insulating portion which is arranged to the light reflecting portion on the opposite side of the light emitting element, contains a base material made of a resin and a filler added to the base material, and has a filler content ratio of 50% or above; and a sealing member which is arranged to cover the light reflecting portion, the insulating portion, and the light emitting element and has translucency.

According to this light emitting apparatus, since a content ratio of the filler is defined, the amount of the resin that can be a source of the gaseous decomposition product can be reduced. Therefore, even if the resin base material deteriorates, an amount of the decomposition produced from the base material is reduced, and an amount of the decomposition product that reaches the light reflecting surface is decreased. Accordingly, dark contamination is hardly produced on the light reflecting surface.

An illumination apparatus of some embodiments comprise: a main body; and the light emitting apparatus according to one of the aforementioned embodiments which is supported by this main body.

According to this illumination apparatus, since the light reflection performance of the light reflecting surface of the light emitting apparatus functioning as the light source can be excellently maintained, light emitted from the light emitting elements can be efficiently extracted to the outside of the main body for a long time.

Advantages of the Invention

According to the light emitting apparatus some embodiments, since dark contamination is hardly produced on the light reflecting surface, the light reflection performance of the light reflecting surface can be excellently maintained. Therefore, light emitted from the light emitting element can be efficiently extracted.

According to the light emitting apparatus some embodiments, since the gaseous decomposition product produced from the insulating portion made of the resin hardly reaches the light reflecting surface, the contamination on the light reflecting surface can be avoided.

According to the light emitting apparatus some embodiments, an amount of the gaseous decomposition product which is produced from the insulating portion is reduced, and the sealing member prevents permeation of the decomposition product. Therefore, the light reflecting surface is hardly contaminated, and the light reflection performance of the light reflecting surface can be excellently maintained for a long time.

According to the light emitting apparatus some embodiments, since an amount of the gaseous decomposition product itself which is produced from the insulating portion is reduced, the decomposition product hardly reaches the light reflecting surface, thereby avoiding the contamination on the light reflecting surface.

According to the illumination apparatus some embodiments, the light emitting apparatus that can efficiently extract light emitted from the light emitting element is configured as a light source, thereby obtaining brightness which is sufficient for general illumination.

BRIEF DESCRIPTION OF DRAWINGS

FIG. 10 is a cross-sectional view showing a state that a light emitting apparatus according to a sixth embodiment of the present invention is soldered to a printed wiring board;

FIG. 11 is a cross-sectional view showing a state that the light emitting apparatus according to the sixth embodiment of the present invention is separated from the printed wiring board;

FIG. 13 is a cross-sectional view of a light emitting apparatus according to a seventh embodiment of the present invention;

FIG. 14 is a perspective view of an illumination apparatus according to an eighth embodiment of the present invention; and FIG. 15 is a cross-sectional view of the illumination apparatus according to the eighth embodiment of the present invention.

MODE FOR CARRYING OUT THE INVENTION

First Embodiment

A first embodiment according to the present invention will now be described hereinafter with reference to FIG. 1 to FIG. 3.

Figure 1:
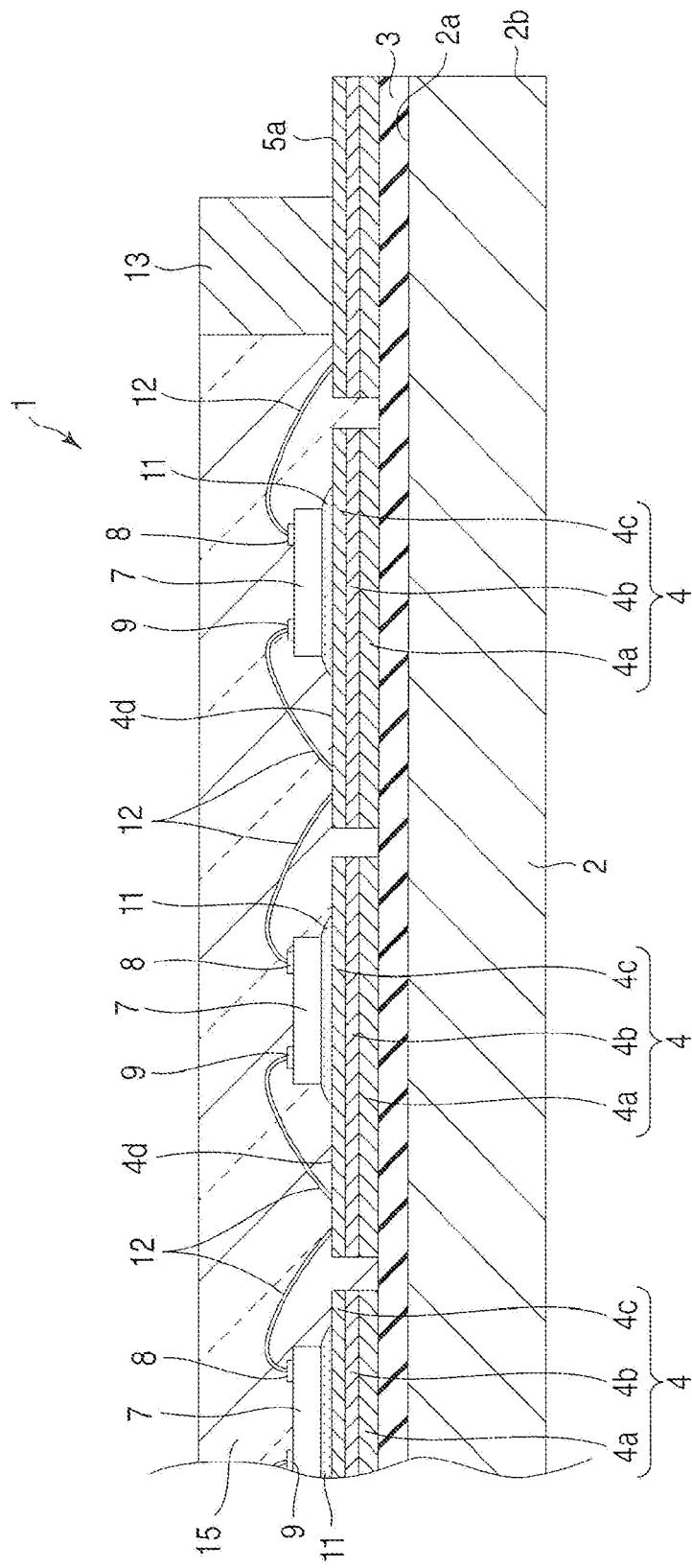
FIG. 1 is a cross-sectional view of a light emitting apparatus according to a first embodiment of the present invention.
Figure 2:
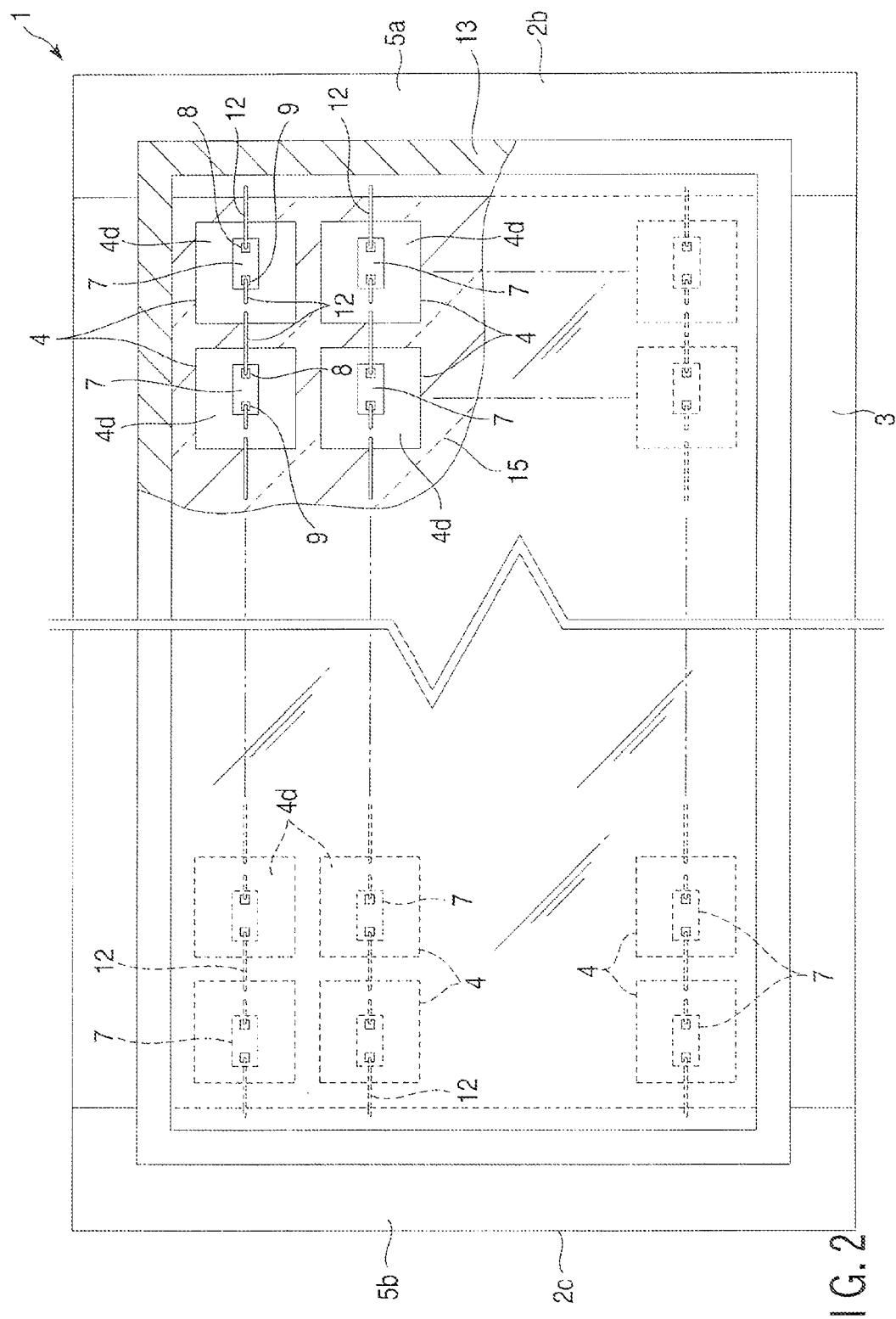
FIG. 2 is a partially cross-sectional plan view showing the light emitting apparatus according to the first embodiment of the present invention.

Each of FIG. 1 and FIG. 2 discloses a light emitting apparatus 1 which is of a chip-on-board (COB) type. The light emitting apparatus 1 is arranged on a focal point of a projector lens group of, e.g., a spotlight and used as a light source of the spotlight.

The light emitting apparatus 1 includes a substrate 2 as a base. The substrate 2 is made of a metal material such as aluminum. The substrate 2 has a rectangular shape having a flat surface 2a. A thickness of the substrate 2 is approximately 1 mm. Further, the substrate 2 has a first end portion 2b and a second end portion 2c. The first end portion 2b and the second end portion 2c are apart from each other in the longitudinal direction of the substrate 2.

An insulating portion 3 is laminated on the surface 2a of the substrate 2. The insulating portion 3 covers the entire surface 2a of the substrate 2. The insulating portion 3 is made of, e.g., a filler-based composite resin obtained by mixing an inorganic filler such as an aluminum oxide ($Al_2O_3$) in an epoxy resin, and a mixing ratio of each of the epoxy resin and the inorganic filler is 50 wt %. Thermal conductivity of the insulating portion 3 is 1.0 W/(m·k), and a thickness of the insulating portion 3 is approximately 80 μm.

When the insulating portion 3 receives light or heat, it gradually deteriorates to produce a gaseous decomposition product containing an organic component. The present inventor prepared an insulating portion containing 50 wt % of the epoxy resin and 50 wt % of the inorganic filler and an insulating portion containing 30 wt % of the epoxy resin and 70 wt % of the inorganic filler and conducted a test of measuring an amount of the decomposition product produced from each of the insulating portions. As a result, it was confirmed that an amount of the decomposition product produced from the insulating portion containing 30 wt % of the epoxy resin and 70 wt % of the inorganic filler is smaller than that produced from the insulating portion containing 50 wt % of the epoxy resin and 50 wt % of the inorganic filler.

A plurality of conductive portions 4 are formed on the substrate 2. Each conductive portion 4 has, e.g., a square shape with four sides, and a length of each side is 1.2 mm. The conductive portions 4 are laminated on the insulating portion 3 in such a manner that they are regularly aligned in a matrix form. The conductive portions 4 adjacent to each other are separated from each other to be electrically insulated. Therefore, the insulating portion 3 is interposed between the conductive portions 4 adjacent to each other and exposed between the conductive portions 4.

The conductive portion 4 is constituted of a sheet of copper foil 4a laminated on the insulating portion 3, a nickel layer 4b laminated on the copper foil 4a, and a silver layer 4c laminated on the nickel layer 4b. A thickness of the copper foil 4a is approximately 35 μm. The nickel layer 4b is formed by performing electroless plating with respect to the copper coil 4a. A thickness of the nickel layer 4b is 3.0 to 5.0 μm. The silver layer 4c is formed by performing electroless plating with respect to the nickel layer 4b. A thickness of the silver layer 4c is 0.3 to 0.7 μm. The silver layer 4c constitutes a surface layer of the conductive portion 4. Therefore, the surface of the conductive portion 4 is a light reflecting surface 4d.

In other words, the conductive portion 4 having the silver layer 4c constitutes a light reflecting portion. The respective light reflecting portions have conductive properties and are provided on the substrate 2 in such a manner that they are regularly aligned on the insulating portion 3 in the matrix form.

The conductive portion 4 is not restricted to the above-described three-layer configuration. For example, the conductive portion 4 may have a single-layer configuration of silver or nickel or a two-layer configuration in which the silver layer or the nickel layer is laminated on the copper foil.

As shown in FIG. 2, a pair of terminal portions 5a and 5b for energization are laminated on the insulating layer 3. Each of the terminal portions 5a and 5b has the same three-layer configuration as that of the conductive portion 4, and its surface layer is constituted of a silver layer. One terminal portion 5a is placed at the first end portion 5b of the substrate 2 and extends in the width direction of the substrate 2. The other terminal portion 5b is placed at the second end portion 2c of the substrate 2 and extends in the width direction of the substrate 2. Therefore, the terminal portions 5a and 5b face each other to sandwich the conductive portions 4 therebetween.

As shown in FIG. 1 and FIG. 2, a light emitting diode 7 is mounted on each conductive portion 4. The light emitting diode 7 is an example of the light emitting element, and a blue light emitting diode that emits blue light is used in this embodiment.

The light emitting diode 7 has a rectangular shape when seen in a plan view, and it has a wide side length of approximately 0.4 mm and a narrow side length of approximately 0.25 mm. The light emitting diode 7 has a pair of element electrodes 8 and 9. The element electrodes 8 and 9 are made of gold and aligned at an interval in the longitudinal direction of the light emitting diode 7.

The light emitting diode 7 is bonded at a central part of the light reflecting surface 4d of the conductive portion 4. Since the light emitting diode 7 is smaller than the conductive portion 4, the light reflecting surface 4d protrudes around the light emitting diode 7.

Bonding wires 12 are connected to the element electrodes 8 and 9 of the light emitting diode 7, respectively. As the bonding wire 12, a gold fine wire is used, for example. The bonding wire 12 connected to the one element electrode 8 of the light emitting diode 7 is connected to the conductive portion 4 to which this light emitting diode 7 is bonded. The bonding wire 12 connected to the other element electrode 9 of the light emitting diode 7 is connected to an adjacent conductive portion 4.

The light emitting diodes 7 placed on the substrate 2 may be electrically connected to the terminal portions 5a and 5b in series or in parallel, or light emitting diode strings each having several light emitting diodes 7 connected in series may be electrically connected to the terminal portions 5a and 5b in parallel.

As shown in FIG. 1 and FIG. 2, a frame body 13 is fixed on an outer peripheral portion of the insulating portion 3. The frame body 13 is made of an insulating material such as a synthetic resin and collectively surrounds the conductive portions 4 and the light emitting diodes 7. Further, the frame body 13 cuts across on the terminal portions 5a and 5b. The terminal portions 5a and 5b are partially exposed to the outside of the frame body 13 to enable connection with a non-illustrated power supply cables.

A region surrounded by the frame body 13 is filled with a sealing member 15. The sealing member 15 is made of, e.g., a resin material having optical transparency such as a transparent dimethyl silicone resin. The resin material is injected in the form of liquid into the region surrounded by the frame body 13. The frame body 13 has a function as a weir that prevents the liquid resin material from flowing to the outside of the region.

The sealing member 15 that has been injected in the inner side of the frame body 13 is solidified when heated/dried. As shown in FIG. 1 and FIG. 2, the sealing member 15 seals the conductive portions 4, the light emitting diodes 7, and the bonding wires 12 on the insulating portion 3.

The sealing member 15 fills respective gaps between the conductive portions 4 adjacent to each other and continuously covers the insulating portion 3 exposed from the gaps between the conductive portions 4. The sealing member 15 fills gaps between the conductive portions 4 and the terminal portions 5a and 5b and also continuously covers the insulating portion 3 exposed from the spaces between the conductive portions 4 and the terminal portions 5a and 5b. Furthermore, the sealing member 15 fills gaps between the conductive portions 4 and the frame body 13 and also continuously covers the insulating portion 3 exposed from the gaps between the conductive portions 4 and the frame body 13.

In this embodiment, a YAG fluorescent material is mixed in the sealing member 15. The fluorescent material is uniformly dispersed in the sealing member 15. As the fluorescent material, a yellow fluorescent material that is excited by blue light emitted from the light emitting diodes 7 to emit yellow light is used.

The fluorescent material mixed in the sealing member 15 is not restricted to the yellow fluorescent material. For example, to improve color rendering properties of light emitted from the light emitting diodes 7, a red fluorescent material that is excited by the blue light to emit red light or a green fluorescent material that emits green light may be added to the sealing member 15.

In such a light emitting apparatus 1, a voltage is applied to the conductive portions 4 on the substrate 2 through the terminal portions 5a and 5b. As a result, the light emitting diodes 7 on the conductive portions 4 emit light at the same time. The blue light emitted from the light emitting diodes 7 enters the sealing member 15. The blue light that have entered the sealing member 15 is partially absorbed by the yellow fluorescent material. The remaining blue light is radiated to the outside of the light emitting apparatus 1 through the sealing member 15 without striking on the yellow fluorescent material.

The yellow fluorescent material that has absorbed the blue light is excited to mainly emit yellow light. The yellow light is radiated to the outside of the light emitting apparatus 1 through the sealing member 15. As a result, the yellow light and the blue light are mixed to turn to white light, and this white light is used for illumination.

A majority of light traveling from the light emitting diodes 7 to the conductive portions 4 strikes the light reflecting surfaces 4d of the conductive portions 4 and are reflected to a light utilizing direction by the light reflecting surfaces 4d.

According to this embodiment, a total area of the conductive portions 4 in the region surrounded by the frame body 13 is larger than a total area of the insulating portion 3 exposed from the peripheries of the conductive portions 4. Specifically, the total area of the conductive portions 4 placed on the inner side of the frame body 13 accounts for approximately 70 to 90% of a total area of the region surrounded by the frame body 13.

As a result, the light traveling from the light emitting diodes 7 toward the conductive portions 4 and the light refracted in the sealing member 13 to travel to the conductive portions 4 can be efficiently reflected to the light utilizing direction by the light reflecting surfaces 4d of the conductive portions 4. Therefore, the light emitted from the light emitting diodes 7 can be efficiently extracted to the outside of the light emitting apparatus 1.

In this embodiment, oxygen gas permeability of the sealing member 15 is defined as 40000 cc/m$^2$·day or below. A reason for this definition will now be described based on a result of measuring a lumen maintenance factor of the light emitting apparatus 1.

Figure 3:
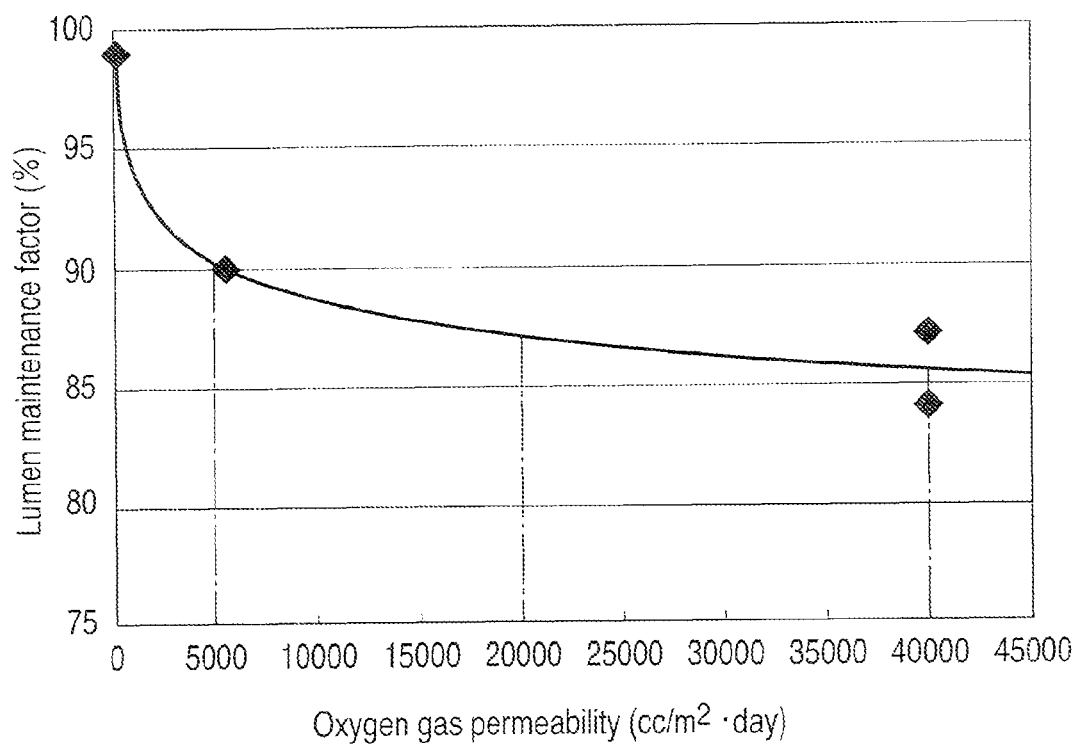
FIG. 3 is a characteristic view showing a relationship between oxygen gas permeability and a lumen maintenance factor in the light emitting apparatus according to the first embodiment of the present invention.

FIG. 3 shows transition of the lumen maintenance factor of the light emitting apparatus 1 obtained when the oxygen gas permeability of the sealing member 15 is changed. The lumen maintenance factor shown in FIG. 3 is a value obtained after a current which is 2.5 times a rated current is supplied to the light emitting diodes 7 with a junction temperature of the light emitting diodes 7 determined as 100° C., and lighting is carried out for 1000 hours.

The oxygen gas permeability of the sealing member 15 was measured based on JISK7129 "Plastic—Film and Sheet—How to Obtain Water Vapor Permeability (Equipment Measuring Method)" and JISK7126-1 "Plastic—Film and Sheet—Gas Permeability Test Method—First Section: Differential-pressure Method".

As obvious from FIG. 3, to maintain the lumen maintenance factor of the light emitting apparatus 1 to 85% or above which is a value enabling acquisition of ideal brightness for general illumination, the oxygen gas permeability of the sealing member 15 must be suppressed to 40000 cc/m$^2$·day or below.

When the oxygen gas permeability of the sealing member 15 is set to 20000 cc/m$^2$·day or below in particular, the lumen maintenance factor of the light emitting apparatus 1 can be maintained at 87% which is a value higher than an ideal value. Furthermore, it can be understood from a characteristic curve in FIG. 3 showing a relationship between the oxygen gas permeability and the lumen maintenance factor that the lumen maintenance factor is tend to precipitously increase when the oxygen gas permeability is 5000 cc/m$^2$·day. Moreover, when the oxygen gas permeability is 5000 cc/m$^2$·day, approximately 90% that exceeds the ideal value can be assured as the lumen maintenance factor. Therefore, it is optimum to set the oxygen gas permeability of the sealing member 15 to 5000 cc/m$^2$·day or below.

It is to be noted that setting a lower limit of the oxygen gas permeability to zero is desirable, but the lumen maintenance factor that can obtain sufficient brightness for general illumination can be assured if the oxygen gas permeability is approximately 1000 cc/m$^2$·day.

According to verification carried out by the present inventor, even if materials of the substrate 2 and the sealing member 15 are changed, how the lumen maintenance factor varies is substantially equal to or similar to that of the light emitting apparatus 1 according to the first embodiment. Further, when the resin material constituting the insulating portion 3 and a ratio of the total area of the conductive portions 4 with respect to the total area of the region surrounded by the frame body 13 are changed, although an absolute value of the lumen maintenance factor differs, but the tendency that the lumen maintenance factor varies is substantially equal or similar.

According to the first embodiment, when the oxygen gas permeability of the sealing member 15 is set to 40000 cc/m$^2$·day or below, 85% or above which is the value that enables obtaining sufficient brightness for general illumination can be acquired as the lumen maintenance factor of the light emitting apparatus 1.

Considering a reason for this phenomenon, when the insulating portion 3 deteriorates because of heat and light emitted from the light emitting diodes 7 and the gaseous decomposition product containing an organic component is produced from the insulating portion 3, the decomposition product may possibly permeate the sealing member 15 from the gaps between the conductive portions 4 and reach the light reflecting surfaces 4d of the conductive portions 4.

In the first embodiment, since the oxygen gas permeability of the sealing member 15 is defined as 40000 cc/m$^2$·day or below, the decomposition product hardly permeates the sealing member 15. Therefore, the decomposition product can be prevented from reaching the upper sides of the light reflecting surfaces 4d covered with the sealing member 15 and, even if the decomposition product has reached the upper sides of the light reflecting surfaces 4d, an amount of the decomposition product that has reached these surfaces can be suppressed. Therefore, dark contamination is hardly formed on the light reflecting surfaces 4d, and the light reflection performance of the light reflecting surfaces 4d can be excellently maintained.

As a result, the light traveling from the light emitting diodes 7 to the conductive portions 4 can be efficiently reflected toward the outside of the light emitting apparatus 1 by the light reflecting surfaces 4d, which reveals the fact that the uncontaminated light reflecting surfaces 4d effectively contribute to an increase in the lumen maintenance factor of the light emitting apparatus 1.

On the other hand, when this type of light emitting apparatus 1 is used in, e.g., an environment that large amounts of corrosive gas and water vapor are produced, the corrosive gas and the water vapor may possibly permeate the sealing member 15 and reach the light reflecting surfaces 4d of the conductive portions 4 and the element electrodes 8 and 9 of the light emitting diodes 7.

Whereas, in this embodiment, since the oxygen gas permeability of the sealing member 15 is defined as 40000 cc/m$^2$·day or below, the corrosive gas and the water vapor are blocked by the sealing member 15 itself and hardly reach the light reflecting surfaces 4d or the element electrodes 8 and 9.

As a result, the light reflecting surfaces 4d that reflect the light traveling from the light emitting diodes 7 to the conductive portions 4 can be prevented from being exposed to the corrosive gas and the water vapor to be discolored. Therefore, the light reflection performance of the light reflecting surfaces 4d can be excellently maintained, and the light traveling from the light emitting diodes 7 to the conductive portions 4 can be efficiently reflected toward the light utilizing direction.

Furthermore, the element electrodes 8 and 9 of the light emitting diodes 7 can be protected from the corrosive gas and the water vapor. As a result, there can be obtained an advantage that the element electrodes 8 and 9 are hardly corroded and a life of each light emitting diode 7 becomes long.

The present inventor conducted the following test to verify an effect when the oxygen gas permeability of the sealing member 15 is set to 40000 cc/m$^2$·day or below.

In this test, the light emitting apparatus 1 was put together with 50 g of sulfur powder in a glass bottle of 100 cc and left at a temperature of 80° C. for 24 hours. When the light emitting apparatus 1 is left at a constant temperature, it is exposed to a sulfur oxide (Sox) produced by the sulfur powder.

The corrosive gas such as a sulfur oxide permeates the sealing member 15 of the light emitting apparatus 1 and reaches the light reflecting surfaces 4d or the element electrodes 8 and 9. When the oxygen gas permeability of the sealing member 15 is set to 40000 cc/m$^2$·day or below, the corrosive gas hardly permeates the sealing member 15. When the corrosive gas is blocked by the sealing member 15, the corrosive gas hardly adheres to the light reflecting surfaces 4d or the element electrodes 8 and 9, thereby avoiding discoloration of the light reflecting surfaces 4d or corrosion of the element electrodes 8 and 9.

According to this test, in the light emitting apparatus 1 using the sealing member 15 having the oxygen gas permeability of 40000 cc/m$^2$·day or below, the discoloration of the light reflecting surfaces 4d or the corrosion of the element electrodes 8 and 9 were not visually recognized even if the light emitting apparatus 1 was left at a constant temperature for 24 hours, and it was confirmed that the permeation of the corrosive gas was prevented.

The present invention is not restricted to the first embodiment, and it can be modified and carried out in many ways without departing from the essence of the present invention.

For example, the light emitting apparatus can be applied as not only a light source for a spotlight but also a light source for, e.g., a road lighting fixture.

Moreover, a circuit component constituting a lighting circuit for the light emitting diodes may be mounted on the substrate to stabilize a lighting state of the light emitting diodes.

Second Embodiment

Figure 4:
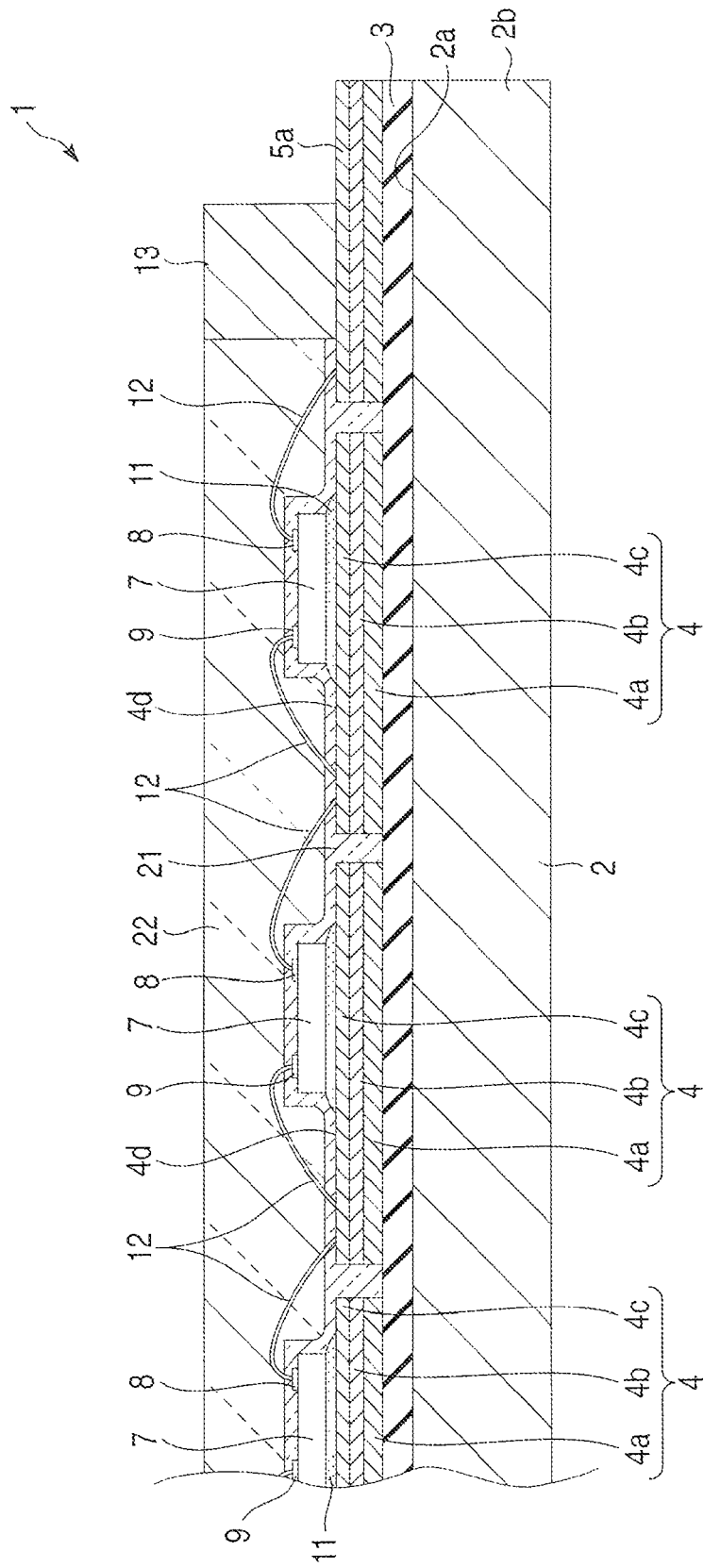
FIG. 4 is a cross-sectional view of a light emitting apparatus according to a second embodiment of the present invention.

FIG. 4 discloses a light emitting apparatus according to a second embodiment of the present invention.

The second embodiment is different from the first embodiment in a configuration that avoids contamination of light reflecting surfaces of conductive portions. Other basic structures in the light emitting apparatus are equal to those in the first embodiment. Therefore, in the second embodiment, like reference numbers denote constituent parts equal to those in the first embodiment, thereby omitting a description thereof.

As shown in FIG. 4, a region surrounded by a frame body 13 is filled with a first sealing member 21. The first sealing member 21 is made of a resin material, e.g., a silicone resin, a fluorine resin, or an acrylic resin. The resin material has optical transparency and oxygen gas permeability of 5000 cc/m$^2$·day or below.

The resin material is applied in the form of liquid to upper sides of conductive portions 4 and light emitting diodes 7 and covers the entire region surrounded by the frame body 13. In other words, the resin material continuously covers the conductive portions 4, the light emitting diodes 7, connecting portions between element electrodes 8 and 9 of the light emitting diodes 7 and bonding wires 12, an insulating portion 3 exposed between the conductive portions 4, the insulating portion 3 exposed between the conductive portions 4 and terminal portions 5a and 5b, and the insulating portion 3 exposed between the conductive portions 4 and the frame body 13.

The resin material constituting the first sealing member 21 is solidified when heated/dried. As a result, the light emitting diode elements 7 are sealed on light reflecting surfaces 4d of the conductive portions 4.

Furthermore, it is good enough for the first sealing member 21 to have a thickness that allows covering the conductive portions 4, the light emitting diodes 7, and the connecting portions between the element electrodes 8 and 9 and the bonding wires 12, and it is placed on a bottom of the region surrounded by the frame body 13. Therefore, a large part of the bonding wires 12 is not covered with the first sealing member 15.

The region surrounded by the frame body 13 is filled with a second sealing member 22. The second sealing member 22 is made of, e.g., a resin material having optical transparency. The resin material is injected in the form of liquid into the region surrounded by the frame body 13 and covers portions of the bonding wires 12 which are exposed to the outside of the first sealing member 21.

A resin material constituting the second sealing member 22 is solidified when heated/dried. As a result, the second sealing member 22 is laminated on the first sealing member 21 and fills the region surrounded by the frame body 13.

According to such a second embodiment, the light reflecting surfaces 4d of the conductive portions 4 protruding around the light emitting diodes 7 are covered with a first sealing member 21 having oxygen gas permeability of 5000 cc/m$^2$·day or below. Therefore, even if the insulating portion 3 produces a gaseous decomposition product, the first sealing member 21 prevents permeation of the decomposition product.

Therefore, the decomposition product can be prevented from reaching the light reflecting surfaces 4d and, even if the decomposition product has reached the light reflecting surfaces 4d, an amount of the decomposition product which has reached the light reflecting surfaces 4d can be suppressed. As a result, dark contamination is hardly formed on the light reflecting surfaces 4d, and light reflection performance of the light reflecting surfaces 4d can be excellently maintained.

Furthermore, since the first sealing member 21 functions as a gas barrier for the light reflecting surfaces 4d, the oxygen gas permeability does not have to be considered in regard to the second sealing member 22 laminated on the first sealing member 21.

In general, a resin material having high oxygen gas permeability is more flexible than a resin material having low oxygen gas permeability. Therefore, making the second sealing member 22 that covers the bonding wires 12 by using a soft resin enables reducing stress applied to the bonding wires 12 even if the second sealing member 22 expands or contracts because of a thermal effect of the light emitting diodes 7.

Therefore, disconnection of the bonding wires 12 can be avoided, and damage to junctions of the bonding wires 12 and the element electrodes 8 and 9 of the light emitting diodes 7 can be prevented.

On the other hand, when the light emitting apparatus 1 is used in an environment that large amounts of corrosive gas and water vapor are produced, the corrosive gas and the water vapor unavoidably permeate the second sealing member 12.

Whereas, in the second embodiment, since the first sealing member 21 having the oxygen gas permeability of 5000 cc/m$^2$·day or below is present below the second sealing member 12, the first sealing member 21 can interrupt a flow of the corrosive gas and the water vapor flowing traveling toward the light emitting diodes 7 or the conductive portions 4.

Therefore, the light reflecting surfaces 4d of the conductive portions 4 and the element electrodes 8 and 9 of the light emitting diodes 7 can be protected from the corrosive gas or the water vapor. Accordingly, discoloration of the light reflecting surfaces 4d and corrosion of the element electrodes 8 and 9 can be avoided.

Third Embodiment

Figure 5:
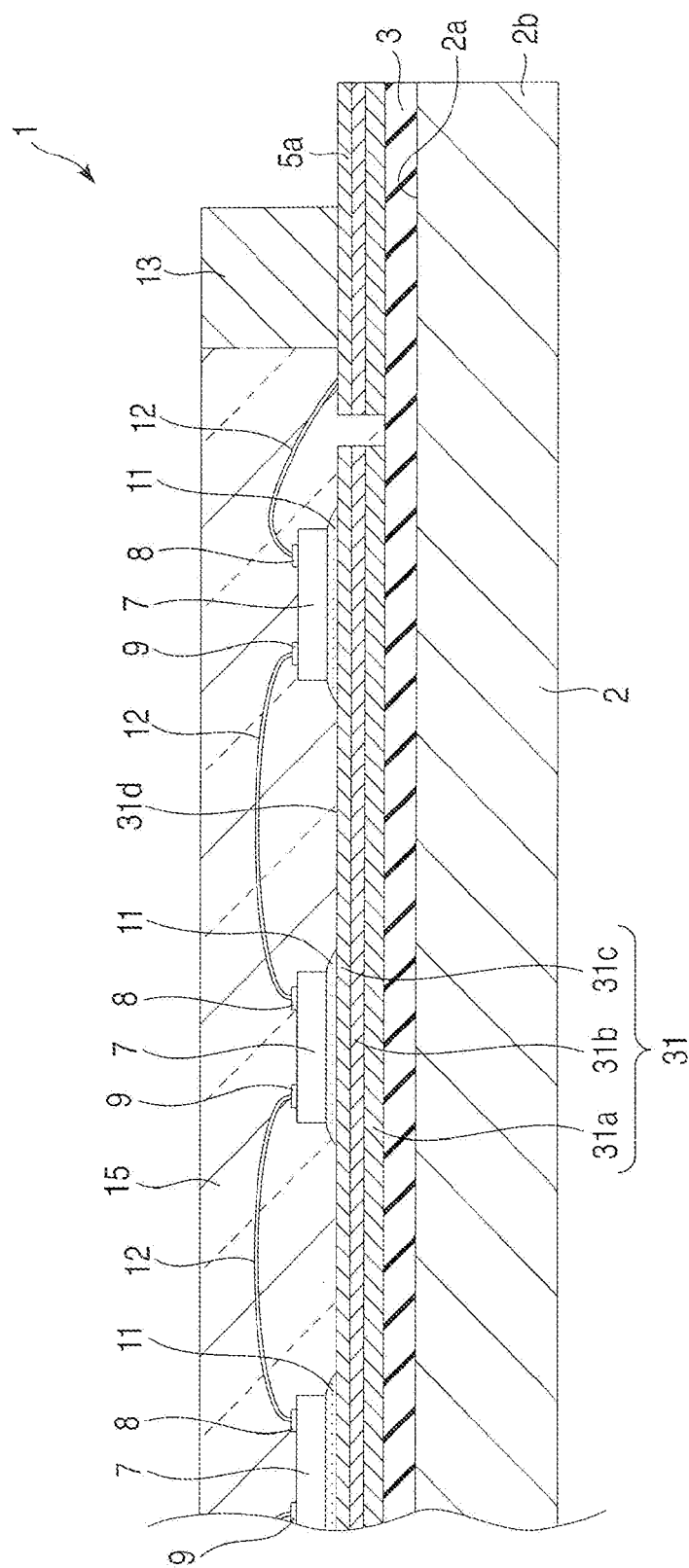
FIG. 5 is a cross-sectional view of a light emitting apparatus according to a third embodiment of the present invention.
Figure 6:
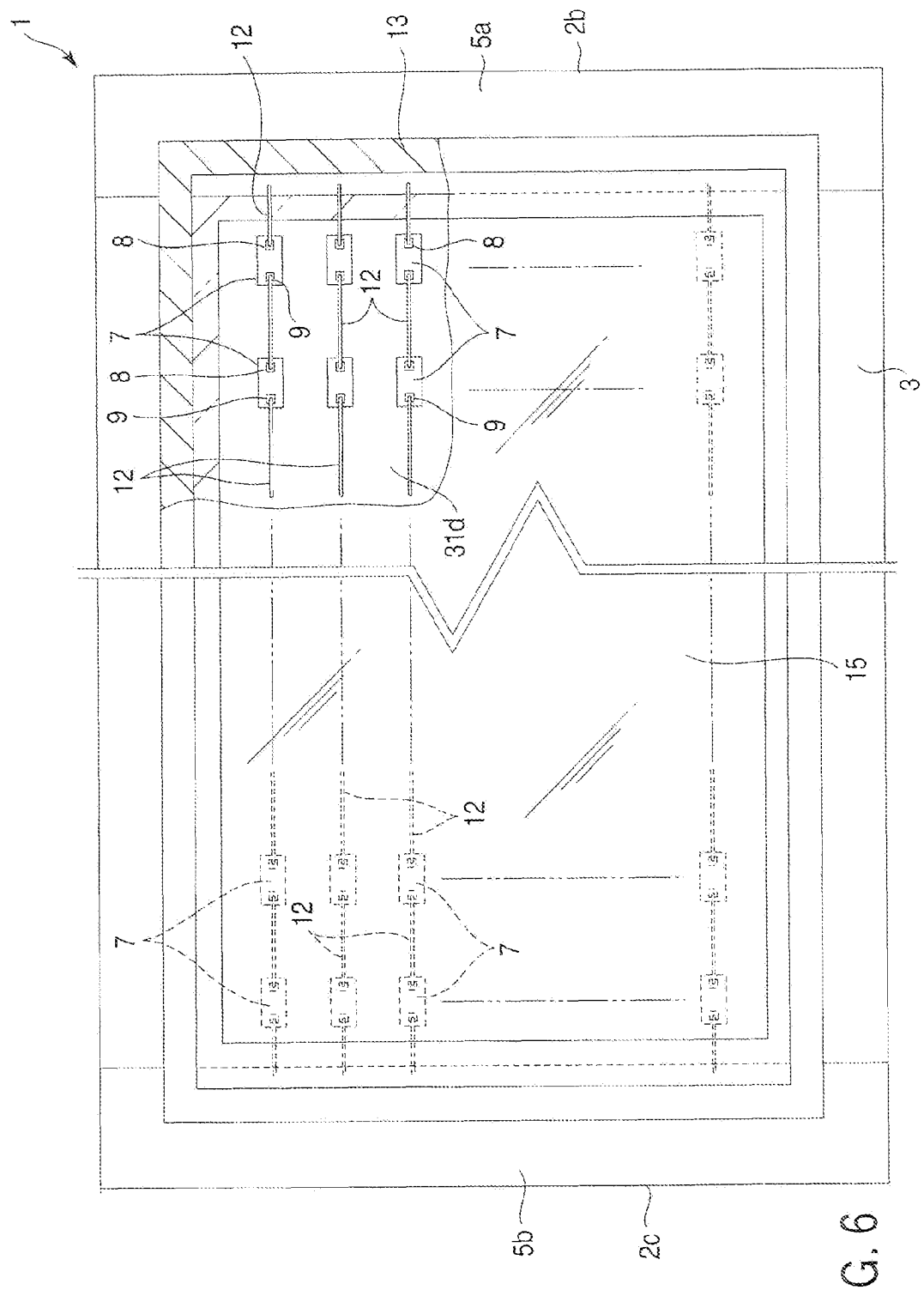
FIG. 6 is a partially cross-sectional plan view of the light emitting apparatus according to the third embodiment of the present invention.

FIG. 5 and FIG. 6 disclose a light emitting apparatus according to a third embodiment of the present invention.

The third embodiment is different from the first embodiment in a configuration that light emitting diodes are mounted on a substrate. Other structures in the light emitting apparatus are equal to those in the first embodiment. Therefore, in the third embodiment, like reference numbers denote constituent parts equal to those in the first embodiment, thereby omitting a description thereof.

As shown in FIG. 5 and FIG. 6, a single light reflecting portion 31 is formed on a substrate 2. The light reflecting portion 31 has a rectangular shape having a size that enables collective arrangement of light emitting diodes 7, and it accounts for a greater part of a region surrounded by a frame body 13.

The light reflecting portion 31 is constituted of a sheet of copper foil 31a laminated on an insulating portion 3, a nickel layer 31b laminated on the copper foil 31a, and a silver layer 31c laminated on the nickel layer 31b, and it has conductive properties. Respective thicknesses of the copper foil 31a, the nickel layer 31b, and the silver layer 31c are equal to those in the first embodiment. The silver layer 31c constitutes a light reflecting surface 31d exposed to the surface of the light reflecting portion 31.

The light emitting diodes 7 are aligned on the light reflecting surface 31d in a matrix form. Since the adjacent light emitting diodes 7 are apart from each other, the light reflecting surfaced 31d is seamlessly continuous between the light emitting diodes 7.

Bonding wires 12 electrically connect the light emitting diodes 7 linearly aligned on the light reflecting surface 31d in series. Specifically, the bonding wires 12 run across the light emitting diodes 7 adjacent to each other to connect element electrodes 8 and 9 with different polarities of the light emitting diodes 7 adjacent to each other.

As shown in FIG. 6, light emitting diode strings each having several light emitting diodes 7 connected in series are electrically connected between terminal portions 5a and 5b through the bonding wires 12. Therefore, the light emitting diode strings are electrically connected to the terminal portions 5a and 5b in parallel.

A sealing member 15 that fills a region surrounded by a frame body 13 has the same oxygen gas permeability as that in the first embodiment. The sealing member 15 continuously covers the light reflecting surface 31d of the light reflecting portion 31, the light emitting diodes 7, and the bonding wires 12. Moreover, the sealing member 15 fills gaps between the terminal portions 5a and 5b and the light reflecting portion 31 and a gap between the frame body 13 and the light reflecting portion 31, and it covers the insulating portion 3 exposed from the gaps. The gaps filled with the sealing member 15 are placed around the light reflecting portion 31.

According to such a third embodiment, the light reflecting surface 31d of the light reflecting portion 31 having the light emitting diodes 7 fixed thereon is covered with the sealing member 15 having oxygen gas permeability of 40000 cc/m²·day or below. Therefore, even if the insulating portion 3 produces a gaseous decomposition product, the sealing member 15 prevents permeation of the decomposition product.

Therefore, the decomposition product can be prevented from reaching the light reflecting surface 31d and, even if the decomposition product has reached the light reflecting surface 31d, an amount of the decomposition product that has reaches the light reflecting surface 31d can be suppressed. As a result, dark contamination is hardly formed on the light reflecting surface 31d, and light reflection performance of the light reflecting surface 31d can be excellently maintained. Therefore, a lumen maintenance factor of the light emitting apparatus 1 can be prevented from being lowered.

According to the third embodiment, since the light reflecting portion 31 has a size that accounts for a large share of the region surrounded by the frame body 13, a gap from which the insulating portion 3 is exposed is not present between the light emitting diodes 7 adjacent to each other. In other words, each gap from which the insulating portion 3 is exposed in the region surrounded by the frame body 13 is placed around the light reflecting portion 31 only, and a greater part of the insulating portion 3 is covered with the light reflecting portion 31.

Therefore, even if the insulating portion 3 produces a decomposition product, the decomposition product is blocked by the light reflecting portion 31 and hardly reaches the light reflecting surface 31d. Therefore, the configuration that is advantageous to prevention of contamination on the light reflecting surface 31d is provided, which is effective in terms of an increase in lumen maintenance factor of the light emitting apparatus 1.

Additionally, the light reflecting surface 31d accounts for a greater part of the region surrounded by the frame body 13. Therefore, light emitted from the light emitting diodes 7 can be reflected by the light reflecting surface 31d toward a light utilizing direction to be efficiently extracted to the outside of the light emitting apparatus 1.

Further, in the third embodiment, the light reflecting surface 31d of the light reflecting portion 31 is seamlessly continuous between the light emitting diodes 7 adjacent to each other. In other words, the gap from which the insulating portion 3 is exposed is not present between the light emitting diodes 7 adjacent to each other. Therefore, many light emitting diodes 7 can be highly densely arranged on the light reflecting surface 31d, and brightness sufficient for general illumination can be obtained. Furthermore, an unnecessary space can be eliminated between the light emitting diodes 7 adjacent to each other, and an advantage that miniaturization of the light emitting apparatus 1 can be pursued is obtained.

Fourth Embodiment

Figure 7:
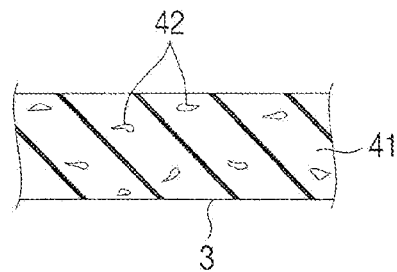
FIG. 7 is a cross-sectional view of an insulating portion included in a light emitting apparatus according to a fourth embodiment of the present invention.
Figure 8:
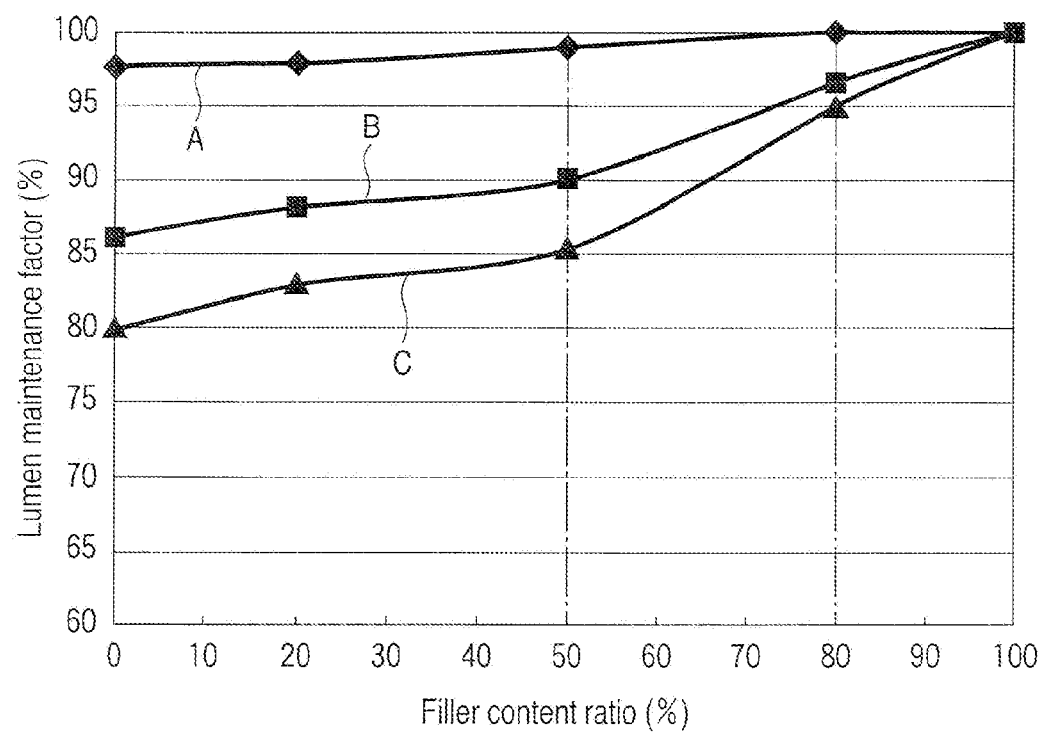
FIG. 8 is a characteristic view showing a relationship between a filler content ratio of the insulating portion and a lumen maintenance factor in the light emitting apparatus according to the fourth embodiment of the present invention.

FIG. 7 and FIG. 8 disclose a fourth embodiment according to the present invention.

The fourth embodiment is different from the first embodiment in that a reduction in an amount of a decomposition product itself produced from an insulating portion is attempted. Since a basic configuration of a light emitting apparatus 1 is equal to that in the first embodiment, a description will be given in the fourth embodiment by using FIG. 1 and FIG. 2 utilized in the first embodiment.

As shown in FIG. 7, an insulating portion 3 of the light emitting apparatus 1 is made of, e.g., a filler-based composite resin obtained by mixing an inorganic filler 42 such as an aluminum oxide ($Al_2O_3$) in an epoxy resin base material 41. The present inventor paid attention to a phenomenon that an amount of a decomposition product produced from the insulating portion 3 is reduced as a content ratio of the inorganic filler is increased with respect to the epoxy resin, and he/she ascertained an influence of the content ratio of the inorganic filler included in the insulating portion 3 on a lumen maintenance factor of the light emitting apparatus 1.

FIG. 8 shows a result of measuring the lumen maintenance factor of the light emitting apparatus 1 when the content ratio of the inorganic filler 42 included in the insulating portion 3 is changed. In the light emitting apparatus 1 as a measurement target, a ratio of a total area of conductive portions 4 in a region surrounded by a frame body 13 and a total area of the insulating portion 3 was set to 4:1. Moreover, the lumen maintenance factor shown in FIG. 8 represents a value obtained after supplying a current which is 2.5 times a rated current to light emitting diodes 7 and lighting the light emitting diodes 7 for 1000 hours with a junction temperature determined as 100° C.

In FIG. 8, a characteristic curve A represents a lumen maintenance factor of the light emitting apparatus 1 when oxygen gas permeability of a sealing member 15 is set to 130 cc/m²·day. A characteristic curve B represents the lumen maintenance factor of the light emitting apparatus 1 when the oxygen gas permeability of the sealing member 15 is set to 5500 cc/m²·day. A characteristic curve C represents the lumen maintenance factor of the light emitting apparatus 1 when the oxygen gas permeability of the sealing member 15 is set to 40000 cc/m²·day.

As obvious from FIG. 8, the lumen maintenance factor can be maintained at a large value of 90% or above by setting the content ratio of the inorganic filler 42 included in the insulating portion 3 to 50% or above even in the light emitting apparatus 1 in which the oxygen gas permeability of the sealing member 15 is set to a relatively high value such as 5500 to 40000 cc/m²·day. When the lumen maintenance factor exceeds 90%, ideal brightness for general illumination can be obtained.

On the other hand, when the content ratio of the inorganic filler 42 included in the insulating portion 3 is less than 50%, the lumen maintenance factor is lower than 90% in the light emitting apparatus 1 in which the oxygen gas permeability of the sealing member 15 is set to a relatively high value such as 5500 to 40000 cc/m²·day.

As shown in FIG. 8, the lumen maintenance factor becomes a higher value as the content ratio of the inorganic filler 42 included in the insulating portion 3 is increasing to 100%. However, when the content ratio of the inorganic filler 42 is increased to a value close to 100%, adhesion properties of the insulating portion 3 may be jeopardized, or a reduction in film thickness of the insulating portion 3 becomes difficult, and hence this increase is not realistic. Therefore, to set the lumen maintenance factor of the light emitting apparatus 1 to a value of 85% or above while assuring a function of the insulating portion 3, the present inventor concluded that setting the content ratio of the inorganic filler 42 to 50 to 80% is preferable.

According to the verification of the present inventor, even though a material of a substrate 2 was changed, a measurement result of the lumen maintenance factor was equal to that of the light emitting apparatus 1 according to the fourth embodiment. Moreover, when a resin material forming the insulating portion 3, a material forming the sealing member 15, and a ratio of a total area of the conductive portions 4 in the region surrounded by the frame body 13 and a total area of the insulating portion 3 were changed, an absolute value of the lumen maintenance factor was different, but the tendency that the lumen maintenance factor changes was substantially equal or similar.

Based on the above verification, when the content ratio of the inorganic filler 42 included in the insulating portion 3 is defined as 50% or above or preferably defined to fall within the range of 50 to 80%, the lumen maintenance factor of the light emitting apparatus 1 can be maintained as a value that enables obtaining sufficient brightness for general illumination.

That is, an amount of a gaseous decomposition product produced from the insulating portion 3 can be suppressed, the decomposition product can be prevented from reaching the light reflecting surfaces 4d, and an amount of the decomposition product that has reached the light reflecting surfaces can be suppressed even if the decomposition product has reached the light reflecting surfaces 4d.

Therefore, the oxygen gas permeability of the sealing member 15 is 40000 cc/m²·day or below, and dark contamination is hardly formed on the light reflecting surfaces 4d, thereby excellently maintaining light reflection performance of the light reflecting surfaces 4d.

Accordingly, light traveling from the light emitting diodes 7 toward the conductive portions 4 can be efficiently reflected to the outside of the light emitting apparatus 1 by the light reflecting surfaces 4d, which reveals the fact that the uncontaminated light reflecting surfaces 4d effectively contributes to an increase in lumen maintenance factor of the light emitting apparatus 1.

Fifth Embodiment

Figure 9:
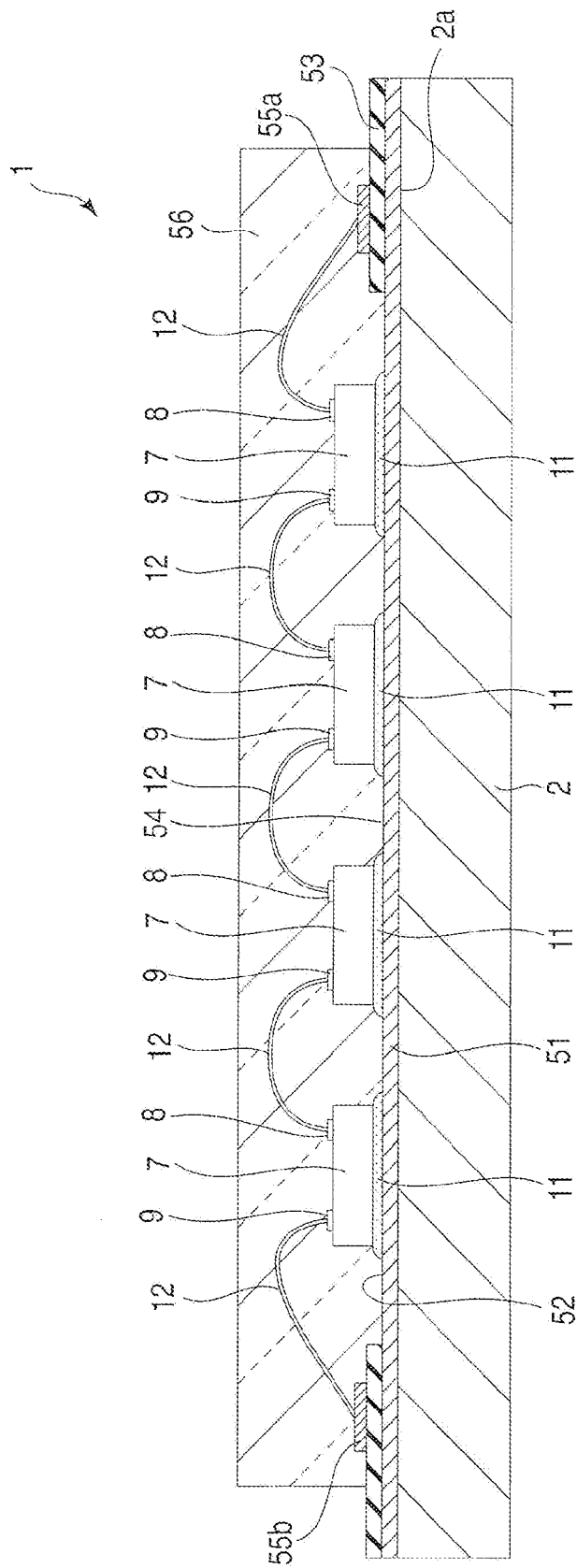
FIG. 9 is a cross-sectional view of a light emitting apparatus according to a fifth embodiment of the present invention.

FIG. 9 discloses a light emitting apparatus according to a fifth embodiment of the present invention.

The fifth embodiment is different from the first embodiment in a configuration for improving thermal radiation properties of light emitting diodes. Other basic structures in the light emitting apparatus are equal to those in the first embodiment.

In the fifth embodiment, a substrate 2 of a light emitting apparatus 1 is made of copper. A silver-plated layer 51 is laminated on a surface 2a of the substrate 2. The silver-plated layer 51 covers the entire surface 2a of the substrate 2 to form a light reflecting surface 52 on the substrate 2.

An insulating portion 53 is laminated on an outer peripheral portion of the light reflecting surface 52 of the substrate 2. The insulating portion 53 is continuous in the circumferential direction of the light reflecting surface 52. The insulating portion 53 is made of, e.g., a filler-based composite resin obtained by mixing an inorganic filler such as an aluminum oxide in an epoxy resin. When this type of insulating portion 53 receives light or heat, it gradually deteriorates and emits a gaseous decomposition product containing an organic component.

The light reflecting surface 52 of the substrate 2 has a square mount region 54 surrounded by the insulating portion 53. Light emitting diodes 7 are mounted in the mount region 54 of the light reflecting surface 52. Each light emitting diode 7 is fixed to the light reflecting surface 52 by using a die bond material 11 and also thermally connected to the substrate 2. Additionally, the light emitting diodes 7 are aligned in a matrix form at intervals on the light reflecting surface 52.

A pair of terminal portions 55a and 55b is arranged on the insulating portion 53. The terminal portions 55a and 55b are made of copper or aluminum and face each other to sandwich the mount region 54 therebetween.

The light emitting diodes 7 linearly aligned on the light reflecting surface 52 are electrically connected in series by bonding wires 12. Specifically, the bonding wires 12 run across the adjacent light emitting diodes 7 to connect element electrodes 8 and 9 with different polarities of the adjacent light emitting diodes 7 to each other. Light emitting diode strings each having several light emitting diodes 7 connected in series are electrically connected between terminal portions 55a and 55b through the bonding wires 12.

The light emitting diodes 7, the bonding wires 12, the insulating portion 53, and the terminal portions 55a and 55b above the light reflecting surface 52 are integrally covered with a sealing member 56. The sealing member 56 has oxygen gas permeability set to 40000 cc/m²·day or below as in the first embodiment. The sealing member 56 covers the entire light reflecting surface 52 and also covers a part of the insulating portion 53.

According to such a fifth embodiment, the light emitting diodes 7 involve heat when emitting light. The heat produced by the light emitting diodes 7 is directly transferred to the substrate 2 through die bond materials 11 and discharged to the outside of the light emitting apparatus 1 from the substrate 2.

Since the substrate 2 is formed of copper having excellent thermal conductivity, it efficiently absorbs and diffuses the heat of the light emitting diodes 7. Therefore, the thermal radiation properties of the light emitting diodes 7 are improved, thus excellently maintaining light emission efficiency of the light emitting diodes 7.

Further, the sealing member 56 that continuously covers a region extending from the light reflecting surface 52 to the insulating portion 53 has oxygen gas permeability defined as 40000 cc/m$^2$·day or below. Therefore, even if the insulating portion 53 produces a gaseous decomposition product, the sealing member 56 prevents permeation of the decomposition product.

As a result, the decomposition product can be prevented from reaching the light reflecting surface 52 covered with the sealing member 56, and an amount of the decomposition product, which has reached the light reflecting surface 52, itself can be suppressed even if the decomposition product has reached the light reflecting surface 52. Therefore, dark contamination is hardly formed on the light reflecting surface 52, and light reflection performance of the light reflecting surface 52 and a lumen maintenance factor of the light emitting apparatus 1 can be excellently maintained.

On the other hand, even if this type of light emitting apparatus 1 is used in, e.g., an environment where large amounts of corrosive gas and water vapor are produced, the corrosive gas and the water vapor are blocked by the sealing member 56 itself, and they hardly reach the light reflecting surface 52 and element electrodes 8 and 9 of the light emitting diodes 7.

As a result, the light reflecting surface 52 that reflects light from the light emitting diodes 7 can be prevented from being exposed to the corrosive gas and the water vapor to be discolored. Therefore, the light reflection performance of the light reflecting surface 52 can be excellently maintained, and the light traveling from the light emitting diodes 7 toward the substrate 2 can be efficiently reflected toward a light utilizing direction.

Moreover, the element electrodes 8 and 9 of the light emitting diodes 7 can be protected from the corrosive gas and the water vapor. As a result, the element electrodes 8 and 9 are rarely corroded, thereby prolonging a life of each light emitting diode 7.

Sixth Embodiment

Figure 12:
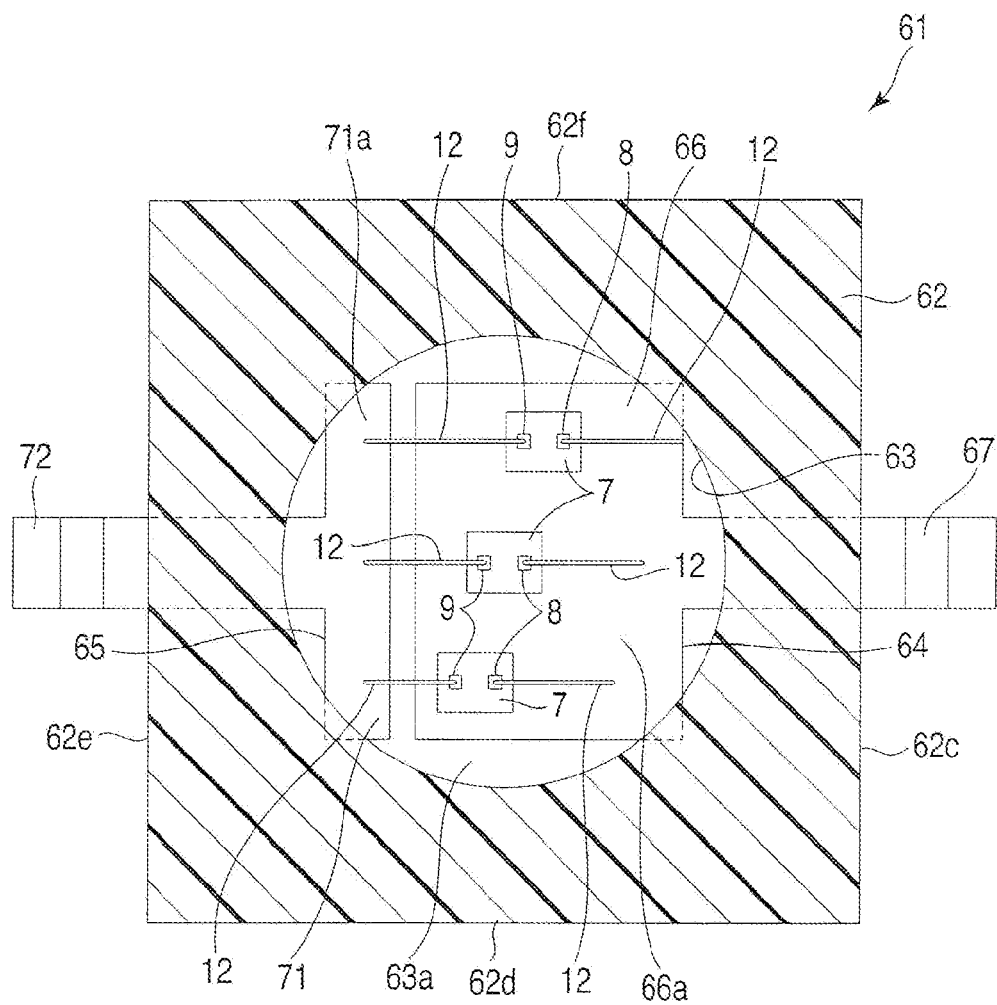
FIG. 12 is a cross-sectional view taken along line XII-XII in FIG. 11.

FIG. 10 to FIG. 12 show a sixth embodiment according to the present invention.

According to the sixth embodiment, the present invention is applied to an SMD (surface mount device) type light emitting apparatus 61. As shown in FIG. 10 and FIG. 11, the light emitting apparatus 61 comprises a package main body 62 as a base. The package main body 62 is made of, e.g., a resin material such as an epoxy resin and has electric insulation properties. The package main body 62 has a square body shape having a flat lower surface 62a, an upper surface 62b, and four peripheral surfaces 62c to 62f.

The package main body 62 includes a concave portion 63. The concave portion 63 is opened in the upper surface 62b of the package main body 62 and has a bottom surface 63a that faces an opening end of the concave portion 63.

As shown in FIG. 10 to FIG. 12, first and second lead frames 64 and 65 are provided to the package main body 62. Each of the first and second lead frames 64 and 65 is constituted by performing, e.g., silver plating with respect to copper and has conductive properties.

The first lead frame 64 has a mount portion 66 and a lead piece 67. The mount portion 66 has a square plate-like shape and is laminated on the bottom surface 63a of the concave portion 63 to cover a greater region of the bottom surface 63a. A surface of the mount portion 66 functions as a light reflecting surface 66a subjected to silver plating. Additionally, the mount portion 66 has a convex portion 68 that projects downwards. The convex portion 68 is integrally buried in the bottom of the package main body 62. A flat heat transfer surface 69 is formed at an end of the convex portion 68. The heat transfer surface 69 is exposed to the outside of the package main body 62 so that it can be placed to be level with the lower surface 62a of the package main body 62.

The lead piece 67 of the first lead frame 64 is continuous with one end of the mount portion 66. The lead piece 67 pierces the package main body 62 and protrudes to the outside of the package main body 62 from the peripheral surface 62c of the package main body 62.

The second lead frame 65 comprises a terminal portion 71 and a lead piece 72. The terminal portion 71 has an elongated plate-like shape and is laminated on the bottom surface 63a of the concave portion 63. A surface of the terminal portion 71 functions as a light reflecting surface 71a subjected to silver plating.

The terminal portion 71 and the mount portion 66 are aligned on the bottom surface 63a of the concave portion 63 at an interval. Therefore, the terminal portion 71 and the mount portion 66 are electrically insulated from each other, and the bottom surface 63a is exposed between the terminal portion 71 and the mount portion 66.

The lead piece 72 of the second lead frame 65 is continuous with one end of the terminal portion 71. The lead piece 72 pierces the package main body 62 and protrudes to the outside of the package main body 62 from the peripheral surface 62e of the package main body 62.

As shown in FIG. 12, light emitting diodes 7 are mounted on the light reflecting surface 66a of the mount portion 66. Each light emitting diode 7 is fixed on the light reflecting surface 66a through a die bond material 11. The light emitting diodes 7 are aligned at intervals.

One element electrode 8 of each light emitting diode 7 is connected to the mount portion 66 of the first lead frame 64 through a bonding wire 12. The other element electrode 9 of each light emitting diode 7 is connected to the terminal portion 71 of the second lead frame 65 through the bonding wire 12. Therefore, the light emitting diodes 7 are electrically connected to the lead pieces 67 and 72 in parallel.

As shown in FIG. 10 and FIG. 11, a sealing member 74 is put in the concave portion 63 of the package main body 62. The sealing member 74 is made of, e.g., a resin material having optical transparency such as a transparent dimethyl silicone resin or a phenyl silicone resin and contains a fluorescent material. The resin material is injected in the form of a liquid into the concave portion 63 and solidified when heated/dried. The sealing member 74 has oxygen gas permeability defined as 40000 cc/m$^2$·day or below as in the first embodiment.

The sealing member 74 continuously covers the bottom surface 63a of the concave portion 63, the light reflecting surface 66a of the first lead frame 64, the light reflecting surface 71a of the second lead frame 65, the light emitting diodes 7, and the bonding wires 12.

The SMD type light emitting apparatus 61 is mounted on a printed wiring board 75. A pair of copper pads 76a and 76b are formed on a surface of the printed wiring board 75. The one lead piece 67 protruding to the outside of the light emitting apparatus 61 is soldered to one copper pad 76a. The other lead piece 72 protruding to the outside of the light emitting apparatus 61 is soldered to the other copper pad 76b.

The copper pad 76a has an extending portion 77 that enters a gap between the package main body 62 of the light emitting apparatus 61 and the printed wiring board 75. The extending portion 77 is thermally connected to the heat transfer surface 69 of the convex portion 68 projecting from the mount portion 66. Therefore, heat produced from the light emitting diodes 7 is partially transferred to the printed wiring board 75 through the convex portion 68 of the first lead frame 64 and the copper pad 76a.

According to such a sixth embodiment, when the package main body 62 made of a resin receives light or heat from the light emitting diodes 7, it gradually deteriorates to emit a gaseous decomposition product containing an organic component. Whereas, the sealing member 74 that continuously covers the bottom surface 63a of the concave portion 63 of the package main body 62, the silver-plated light reflecting surfaces 66a and 71a, and the light emitting diodes 7 has oxygen gas permeability defined as 40000 cc/m$^2$·day or below. Therefore, even if the package main body 62 produces the gaseous decomposition product, the sealing member 74 prevents permeation of the decomposition product.

As a result, the decomposition product can be prevented from reaching the light reflecting surfaces 66a and 71a covered with the sealing member 74, and an amount of the decomposition product, which has reached the light reflecting surfaces 66a and 71a, itself can be suppressed even if the decomposition product has reached the light receiving surfaces 66a and 71a.

Therefore, dark contamination is hardly formed on the light reflecting surfaces 66a and 71a, and light reflection performance of the light reflecting surfaces 66a and 71a and a lumen maintenance factor of the light emitting apparatus 61 can be excellently maintained.

Further, when the lead pieces 67 and 72 are soldered to the copper pads 76a and 76b, a flux may possibly reach the light reflecting surfaces 66a and 71a through gaps between the lead pieces 67 and 72 and the package main body 62.

Whereas, in this embodiment, the sealing member 74 can block a flow of the flux traveling toward the concave portion 63 of the package main body 62 by defining the oxygen gas permeability of the sealing member 74. Therefore, discoloration of the light reflecting surfaces 66a and 71a caused by the flux can be avoided.

Moreover, even if the light emitting apparatus 61 is used in, e.g., an environment where large amounts of corrosive gas and water vapor are produced, the corrosive gas and the water vapor are blocked by the sealing member 74 itself, whereby they hardly reach the light reflecting surfaces 66a and 71a and the element electrodes 8 and 9 of the light emitting diodes 7.

As a result, the light reflecting surfaces 66a and 71a that reflect light from the light emitting diodes 7 can be prevented from being exposed to the corrosive gas and the water vapor to be discolored. Therefore, the light reflection performance of the light reflecting surfaces 66a and 71a can be excellently maintained, and light traveling from the light emitting diodes 7 to the first and second lead frames 64 and 65 can be efficiently reflected toward a light utilizing direction.

Additionally, the element electrodes 8 and 9 of the light emitting diodes 7 can be protected from the corrosive gas and the water vapor. As a result, the element electrodes 8 and 9 are hardly corroded, thereby prolonging a life of each light emitting diode 7.

Seventh Embodiment

FIG. 13 discloses a seventh embodiment according to the present invention.

An SMD type light emitting apparatus 81 according to the seventh embodiment comprises a substrate 82 made of ceramic. The substrate 82 is an example of a base, and it has a flat mount surface 82a. A pair of conductor patterns 83 and 84 are formed on the mount surface 82a. The conductor patterns 83 and 84 are made of, e.g., silver and electrically disconnected from each other.

The conductor pattern 84 has a support portion 85 extending to a central part of the mount surface 82a. A light emitting diode 7 is fixed on the support portion 85 through a die bond material 11. One element electrode 8 of the light emitting diode 7 is electrically connected to the one conductor pattern 83 through a bonding wire 12. The other element electrode 9 of the light emitting diode 7 is electrically connected to the conductor pattern 84 through the bonding wire 12.

The mount surface 82a of the substrate 82, the conductor patterns 83 and 84, the light emitting diode 7, and the bonding wires 12 are continuously covered with a sealing member 85. The sealing member 85 is made of a resin material having optical transparency such as a silicone resin and contains a fluorescent material. The sealing member 85 has oxygen gas permeability defined as 40000 cc/m$^2$·day or below as in the first embodiment.

According to such a seventh embodiment, since the substrate 82 is made of ceramics, insulation properties and thermal resistance properties of the light emitting apparatus 81 can be enhanced.

Further, even when the light emitting apparatus 81 is used in, e.g., an environment where large amounts of corrosive gas and water vapor are produced, the corrosive gas and the water vapor are blocked by the sealing member 85 having the oxygen gas permeability of 40000 cc/m$^2$·day or below and hardly reach the element electrodes 8 and 9 of the light emitting diode 7 or the conductor patterns 83 and 84. Therefore, the element electrodes 8 and 9 of the light emitting diode 7 and the conductor patterns 83 and 84 can be protected from the corrosive gas or the water vapor. Consequently, a life of the light emitting apparatus 81 can be prolonged.

Eighth Embodiment

FIG. 14 and FIG. 15 disclose an eighth embodiment according to the present invention.

The eighth embodiment discloses a specific configuration of a spotlight 100 which is an example of an illumination apparatus. The spotlight 100 comprises a pair of light emitting apparatuses 101a and 101b, a main body 102, and a reflector 103.

Each of the light emitting apparatuses 101a and 101b has the same configuration as that of, e.g., the light emitting apparatus 1 according to the first embodiment and has a substrate 104 as a base. A sealing member 105 is laminated on the substrate 104. The sealing member 105 has optical transparency and continuously covers light emitting diodes, bonding wires, conductive portions, and an insulating portion (which are not shown). The sealing member 105 has oxygen gas permeability set to 40000 cc/m$^2$·day or below.

As shown in FIG. 15, the main body 102 of the spotlight 100 comprises a heat sink 107 and a heat receiving portion 108. The heat sink 107 is made of, e.g., a lightweight metal material having excellent thermal conductivity such as aluminum. The heat sink 107 comprises a discoid base portion 109 and radiator fins 110 protruding from a back surface of the base portion 109. Each radiator fin 110 has a flat plate-like shape, and these fins are aligned parallel to each other at intervals.

The heat receiving portion 108 is made of a metal having excellent thermal conductivity such as aluminum or copper and has a square plate-like shape with a predetermined thickness. The heat receiving portion 108 is fixed to a central portion of a surface of the base portion 109 through a screw 111. Therefore, the heat receiving portion 108 protrudes toward the opposite side of the radiator fins 110 from the surface of the base portion 106 and is thermally connected to the base portion 109.

As shown in FIG. 15, the heat receiving portion 108 has a first side surface 113a and a second side surface 113b. The first and second side surfaces 113a and 113b are parallel to each other and extend along the vertical direction.

The respective substrates 104 of the light emitting apparatuses 101a and 101b are fixed to the first and second side surfaces 113a and 113b of the heat receiving portion 108 through non-illustrated screws. A heat transfer sheet 114 is interposed between the substrate 104 of each of the light emitting apparatuses 101a and 101b and each of the first and second side surfaces 113a and 113b. The heat transfer sheet 114 thermally connects each substrate 104 to the heat receiving portion 108.

As the reflector 103, a concave mirror is used. The reflector 103 has a pair of reflection plates 115a and 115b. The respective reflection plates 115a and 115b are fixed to the surface of the base portion 109 of the heat sink 107 through screws 116. The reflection plates 115a and 115b are symmetrically arranged to sandwich the heat receiving portion 108 therebetween. Therefore, the light emitting apparatus 101a fixed to the first side surface 113a of the heat receiving portion 108 faces a light reflecting surface 117a of the reflection plate 115a, and the light emitting apparatus 101b fixed to the second side surface 113b of the heat receiving portion 108 faces a light reflecting surface 117b of the reflection plate 115b.

In this embodiment, to reflect light emitted from the pair of light emitting apparatuses 101a and 101b parallel to an optical axis L of the spotlight 100, the center of a light emission region of each light emitting apparatus 101a or 101b is placed at a focal point of each reflection plate 115a or 115b.

As shown in FIG. 14 and FIG. 15, the reflector 103 is surrounded by a cover 120. The cover 120 includes a cylindrical main body portion 121. One end of the main body portion 121 coaxially abuts on an outer peripheral portion of the surface of the base portion 109 of the heat sink 107. A flared portion 122 is coaxially formed at the other end of the main body portion 121. The flared portion 122 is flared toward the outer side parallel to the radial direction of the main body portion 121 as distanced from the main body portion 121. The flared portion 122 is in contact from the outer side with the outer peripheral portion of the reflector 103 adjacent to an opening end of the reflector 103.

In the spotlight 100 having such a configuration, when the light emitting apparatuses 101a and 101b are operated to emit light, white light transmitted through the sealing members 105 strikes the light reflecting surfaces 117a and 117b of the reflection plates 115a and 115b. The light that has struck the light reflecting surfaces 117a and 117b is reflected by the light reflecting surfaces 117a and 117b to become parallel to the optical axis L of the spotlight 100 and radiated toward an irradiation target from the opening end of the reflector 103.

Each of the light emitting apparatuses 101a and 101b serving as the light source of the spotlight 100 has the same configuration as that of the light emitting apparatus 1 according to the first embodiment. Therefore, the light emitting apparatuses 101a and 101b each having a lumen maintenance factor of 85% or above can be used as the light sources of the spotlight 100. Accordingly, the spotlight 100 that enables obtaining ideal brightness for general illumination can be provided.

Additionally, heat produced by the light emitting diodes when the light emitting apparatuses 101a and 101b emit light is transferred to the heat receiving portion 108 of the main body 102 from the substrates 104. The heat of the light emitting diodes transferred to the heat receiving portion 108 is conducted to the base portion 109 of the heat sink 107 from the heat receiving portion 108 and also discharged into air from the radiator fins 110 of the heat sink 107.

Therefore, heat from the light emitting apparatuses 101a and 101b can be actively discharged by utilizing the main body 102 of the spotlight 100. Accordingly, an excessive increase in temperature of the light emitting diodes included in the light emitting apparatuses 101a and 101b can be avoided, and excellent light emission efficiency of the light emitting apparatuses 101a and 101b can be maintained.

Although the light emitting apparatus according to the first embodiment is used as each light source in the illumination apparatus according to the eighth embodiment, the present invention is not restricted thereto. For example, in place of the light emitting apparatus according to the first embodiment, the light emitting apparatus disclosed in any one of the second embodiment to the seventh embodiment may be utilized as the light source.

Further, the illumination apparatus according to the present invention is not restricted to the spotlight, and it can be likewise carried out as other illumination apparatuses such as a downlight, a security light, a bracket light, or a pendant light.

EXPLANATION OF REFERENCE SYMBOLS 1, 61, and 81 . . . light emitting apparatus, 2, 62, and 104 . . . base (substrate, package main body), 3 and 53 . . . insulating portion, 7 . . . light emitting element (light emitting diode), 8 and 9 . . . electrode (element electrode), 15, 21, 22, 56, 74, 85, and 105 . . . sealing member, 31 . . . light reflecting portion, 4d, 31d, 52, 66a, and 71a . . . light reflecting surface, 41 . . . base material, 42 . . . filler, 101a and 101b . . . light emitting apparatus, 102 . . . main body.

The invention claimed is:

1. A light emitting apparatus comprising:
a metal base;
an insulating portion provided on the metal base, the insulating portion including a resin base material and a filler, wherein an amount of the filler in the insulating portion is 50%-80% by weight;
a light reflecting surface provided on the insulating portion and made of a silver;
a heat generating light emitting diode mounted on the light reflecting surface; and
a sealing member which covers the insulating portion, the light reflecting surface, and the light emitting diode, the sealing member comprising a translucent resin material, wherein the oxygen gas permeability of the sealing member is 1000 cc/m$^2$ day or above and 40000 cc/m$^2$ day or below.

2. The apparatus according to claim 1, further comprising: a plurality of conductive portions regularly aligned on the insulating portion, wherein the light reflecting surface is formed on each conductive portion.

3. The apparatus according to claim 1, further comprising: a light reflecting portion laminated on the insulating portion, wherein the light reflecting surface is formed on the light reflecting portion.

4. The apparatus according to claim 1, further comprising: a plurality of light reflecting portions regularly aligned on the insulating portion, wherein the light reflecting surface is formed on each light reflecting portion.

5. The apparatus according to claim 1, wherein when the insulating portion receives light or heat generated from the light emitting diode, the insulating portion produces a gaseous decomposition product.

6. An illumination apparatus comprising:
a main body; and
the light emitting apparatus according to claim 1 which is supported by the main body.

* * * * *